(12) United States Patent
Sounart et al.

(10) Patent No.: US 12,389,728 B2
(45) Date of Patent: Aug. 12, 2025

(54) MICRO-LED DISPLAYS INCLUDING SOLDER STRUCTURES AND METHODS

(71) Applicant: Intel Corporation, Santa Clara, CA (US)

(72) Inventors: Thomas L. Sounart, Chandler, AZ (US); Khaled Ahmed, San Jose, CA (US); Anup Pancholi, Hillsboro, OR (US); Shawna M. Liff, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 1239 days.

(21) Appl. No.: 16/946,166

(22) Filed: Jun. 8, 2020

(65) Prior Publication Data

US 2020/0303611 A1 Sep. 24, 2020

(51) Int. Cl.
*H10H 20/857* (2025.01)
*H01L 23/00* (2006.01)
(Continued)

(52) U.S. Cl.
CPC ....... *H10H 20/857* (2025.01); *H01L 25/0753* (2013.01); *H10H 20/01* (2025.01); *H10H 20/0364* (2025.01)

(58) Field of Classification Search
CPC ......... H01L 2933/0066; H01L 33/0095; H01L 25/0753; H01L 33/62; H01L 24/95;
(Continued)

(56) References Cited

U.S. PATENT DOCUMENTS

2017/0048976 A1* 2/2017 Prevatte ................. H05K 1/112
2018/0247584 A1* 8/2018 Chen ................... H01L 25/0753
(Continued)

OTHER PUBLICATIONS

Hess, J., et al.; "Sacrificial ion beam etching process for seed layer removal of 6 μm pitch CuSn micro bumps;" IOP Materials Science and Engineering Spring Meeting; 2012; 8 pages.
(Continued)

*Primary Examiner* — Antonio B Crite
(74) *Attorney, Agent, or Firm* — Alliance IP, LLC

(57) ABSTRACT

A micro-light emitting diode (LED) display and a method of fabricating the same. The method includes aligning a display backplane and a source semiconductor wafer with one another. A plurality of backplane contact pads of a first width are fixed to the backplane and include first solder pads thereon with a second width smaller than the first width. The wafer includes thereon a plurality of micro-LEDs, and a plurality of micro-LED contact pads fixed to the micro-LEDs and having a third width smaller than the first width. The method includes: aligning such that at least some of the micro-LED contact pads register with corresponding first solder pads; releasing at least some of the micro-LEDs from the wafer onto corresponding first solder pads; and forming a plurality of second solder pads by melting the corresponding first solder pads. The second solder pads bond the at least some of the micro-LEDs to corresponding ones of the plurality of backplane contact pads, the second solder pads further extending on said corresponding ones of the plurality of backplane contact pads beyond a footprint thereon of said some of the micro-LEDs.

9 Claims, 12 Drawing Sheets

(51) Int. Cl.
    *H01L 25/075*     (2006.01)
    *H10H 20/01*     (2025.01)
    *H01L 21/683*     (2006.01)

(58) Field of Classification Search
    CPC ....... H01L 24/29; H01L 24/83; H10H 20/857; H10H 20/0364
    See application file for complete search history.

(56) References Cited

U.S. PATENT DOCUMENTS

| | | | |
|---|---|---|---|
| 2020/0294976 A1* | 9/2020 | An | H01L 24/75 |
| 2020/0395348 A1* | 12/2020 | Kwag | H01L 25/0753 |
| 2021/0183833 A1* | 6/2021 | Hu | H01L 25/105 |
| 2021/0343567 A1* | 11/2021 | Han | H01L 21/6835 |
| 2023/0017957 A1* | 1/2023 | Koide | H10H 20/857 |

OTHER PUBLICATIONS

Israelachvili, Jacob N.; "Intermolecular and Surface Forces;" ISBN 978-0-12-391927-4; Academic Press (imprint of Elsevier); 2011; p. 266 only.

Soussan, P., et al.; "Evaluation of Sn-based Microbumping Technology for Hybrid IR Detectors, 10μm Pitch to 5μm Pitch;" published in the Electronic Components & Technology Conference, 2015; 6 pages.

Takemoto, Yoshiaki, et al.; "Characterization of 4 Million Micro-Bump Interconnections at 7.6-μm Pitch for 3-D Stacked 16 Million Pixel Image Sensor;" IEEE Transactions on Semiconductor Manufacturing, vol. 30, No. 3; Aug. 2017; 7 pages.

\* cited by examiner

US 12,389,728 B2

MICRO-LED DISPLAYS INCLUDING SOLDER STRUCTURES AND METHODS

TECHNICAL FIELD

Embodiments relate to micro-light-emitting-diode (LED) displays and, in particular, to a bonding of micro-LEDs to a backplane of the display.

BACKGROUND

Displays having micro-scale light-emitting diodes (LEDs) are known as micro-LED, mLED, and μLED. As the name implies, micro-LED displays have arrays of micro-LEDs forming the individual pixel elements of a display. Micro-LED displays promise a 3× to 5× reduced power consumption as compared to organic LED (OLED) displays. OLED displays are made of small LEDs made of organic materials. Micro-LEDs promise a two-fold emitter" power reduction as compared to OLEDs, and provide improved user experience.

However, the assembly of micro-LEDs includes the transfer and bonding of micro-LEDs elements from source semiconductor wafers to a display backplane of a display. High yield and low cost processes are needed however for the fabrication of micro-LED displays

DETAILED DESCRIPTION

Figure 1:
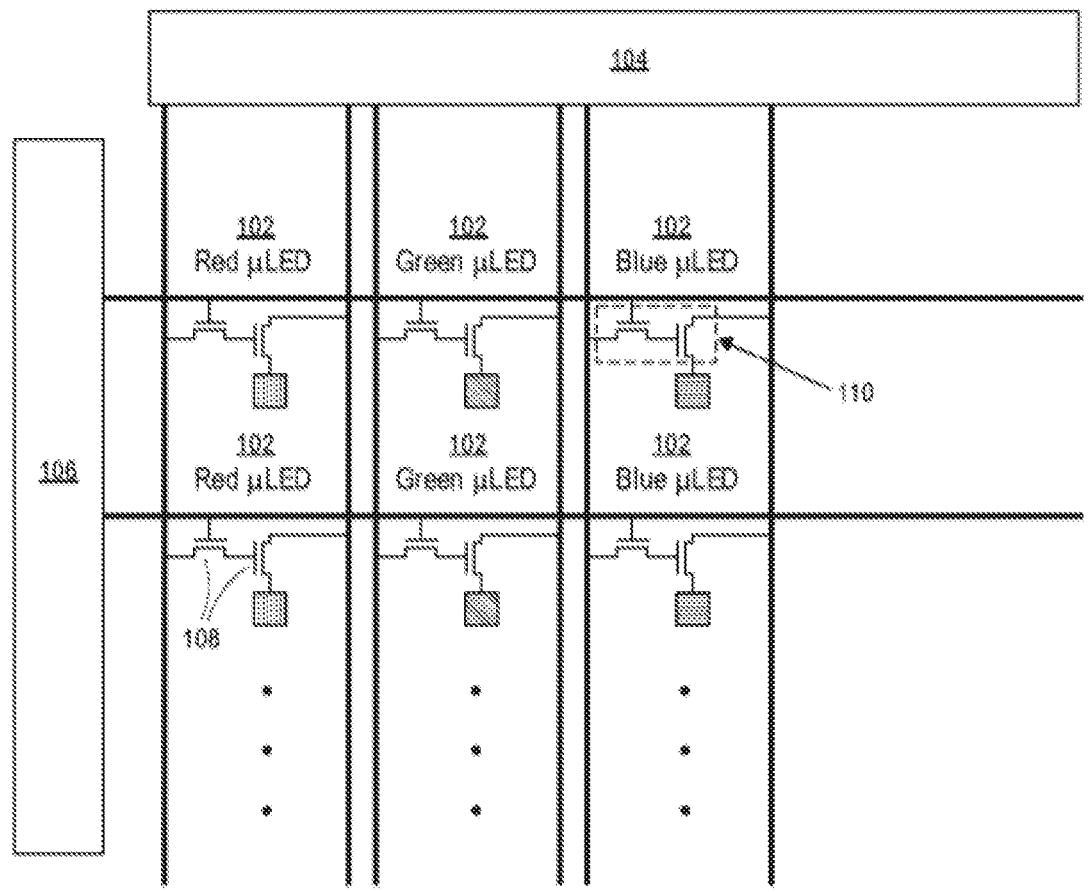
FIG. 1 is a schematic illustration of a micro-LED display architecture, in accordance with an embodiment of the present disclosure.

Embodiments pertain to micro-light-emitting diode (LED) displays and to the fabrication of the same, and to a device and method for making full-color micro-LED displays.

In the following description, specific details are set forth, but embodiments of the technologies described herein may be practiced without these specific details. Well-known circuits, structures, and techniques have not been shown in detail to avoid obscuring an understanding of this description. "An embodiment," "various embodiments," "some embodiments," and the like may include features, structures, or characteristics, but not every embodiment necessarily includes the particular features, structures, or characteristics.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or in any other manner "Connected" may indicate elements are in direct physical or electrical contact with each other and "coupled" may indicate elements co-operate or interact with each other, but they may or may not be in direct physical or electrical contact. Terms modified by the word "substantially" include arrangements, orientations, spacings or positions that vary slightly from the meaning of the unmodified term. For example, a microphone located substantially at the center of a display includes microphones located within a few pixels of the center of the display.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

The description may use the phrases "in an embodiment," "in embodiments," "in some embodiments," and "in various embodiments," each of which may refer to one or more of the same or different embodiments. Furthermore, the terms "comprising," "including," "having," and the like, as used with respect to embodiments of the present disclosure, are synonymous.

Displays based on inorganic micro-LEDs have attracted increasing attention for applications in emerging portable electronics and wearable computers such as head-mounted displays and wristwatches. Micro-LEDs are first manufactured on wafers made, for example, of sapphire or silicon and then transferred onto a display backplane glass substrate on which active matrix thin-film transistors have been manufactured. Micro-LEDs with inorganic LEDs have better reliability then OLEDs.

Similar to OLED, micro-LED technology is an emissive display technology. However, due to the inorganic nature of the emitting materials, their efficiency and narrow emission bands, micro-LEDs also offer the prospect of significantly improved performance in terms of energy consumption, color gamut, brightness, contrast (High Dynamic Range), long lifetime and environmental stability (e.g., no or low sensitivity to air and moisture), and/or compatibility with flexible backplane technologies to enable curved or flexible displays.

Micro-LED arrays produce their own light in response to current flowing through the individual elements of the array. A variety of different LED-like luminescent sources have been used for such displays. The embodiments described herein utilize electroluminescent materials in micro-LEDs made, for example, of GaN, InGaN, AlInGaP materials. Electrically, these devices look like diodes with forward "on" voltage drops ranging from 1.9 volts (V) to 3 V depending on the color. Unlike liquid crystal displays (LCDs), micro-LEDs are current driven devices. However, they may be similarly arranged in a two-dimensional array (matrix) of elements to form a display. Active-matrix micro-LED displays use current control circuits integrated with the display itself, with one control circuit corresponding to each individual element on the substrate to create high-resolution color graphics with a high refresh rate. This structure results in a matrix of devices, one (or more) device formed at each point where a row overlies a column. There will generally be at least M×N devices in a matrix having M rows and N columns Typical micro-LED devices conduct current and luminesce when voltage of one polarity is imposed across them, and block current when voltage of the opposite polarity is applied. To control these individual micro-LED devices located at the matrix junctions, it is useful to have two distinct driver circuits, one to drive the columns and one to drive the rows. It is conventional to sequentially scan the rows (conventionally connected to device cathodes) with a driver switch to a known voltage such as ground, and to provide another driver to drive the columns (which are conventionally connected to device anodes). In operation, information is transferred to the matrix display by scanning each row in sequence. During each row scan period, each column connected to an element intended to emit light is also driven.

Reference is now made to the drawings (which are not to scale), wherein similar or same numbers may be used to designate the same or similar parts in different figures. The use of similar or same numbers in different figures does not mean all figures including similar or same numbers constitute a single or same embodiment. In the following description, for purposes of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modifications, equivalents, and alternatives within the scope of the claims.

FIG. 1 is a schematic illustration of a micro-LED display architecture, in accordance with an embodiment of the present disclosure. Referring to FIG. 1, micro-LED elements 102 are arranged in a matrix. The micro-LED elements are driven through "Data Driver" 104 and "Scan Driver" 106 chips. Thin film transistors 108 are used to make "pixel driver circuits" 110 for each micro-LED element. In an embodiment, micro-LED elements are fabricated on, for example, a silicon or sapphire wafer then transferred to a glass substrate called "backplane" where the "pixel driver circuits" 110 have been fabricated using thin film transistors.

Prior art methods of transferring and bonding micro-LED elements from a wafer to the "backplane" or "display backplane" of a display involve fusion bonding (FB) or thermo-compression bonding (TCB) of the contact pads of the micro-LED elements on the wafer with corresponding contacts of the display backplane. The contact pads are typically made of any suitable conducting material, such as, for example, metal (for example, copper, nickel, gold, tungsten, titanium, tantalum, ruthenium, zirconium, cobalt, aluminum, lead, platinum, tin, silver), conducting metallic compound material (for example, copper nitride, tantalum nitride, titanium nitride, tantalum carbide, titanium carbide, titanium aluminum carbide, tungsten silicide, tungsten nitride, ruthenium oxide, cobalt silicide, nickel silicide), carbon nanotubes, conductive carbon, graphene, or any suitable combination of these materials. The conductive material can further include dopants that are incorporated during or after deposition. In one embodiment, the contacts can be copper or tungsten and can include a barrier metal liner (not depicted). A barrier metal liner prevents copper or tungsten from diffusing into, or doping, the surrounding materials, which can degrade their properties. Some semiconductor materials, such as silicon, form deep-level traps when doped with copper. An ideal barrier metal liner must limit the bulk metal diffusivity sufficiently to chemically isolate the conductor from the surrounding materials and should have a high electrical conductivity, for example, tantalum, tantalum nitride, titanium, titanium nitride, cobalt, ruthenium, manganese, or titanium carbide.

Such bonding methods require a high degree of smoothness of the free surfaces of the contact pads. For example, copper contact pad surfaces need to have surface roughness less than about 0.5 nm in order for either FB or TCB to the backplane contact pads to be feasible. However, such a high degree of smoothness is difficult to achieve on the display side of the assembly, mainly as a result of a lack of commercial copper chemical-mechanical planarization (CMP) tools that work on rectangular substrates. In addition, FB and TCB are typically slow processes, which results in high costs of production of micro-LED displays. In addition, not only does TCB require low roughness oxide-free contact pads, it also requires well-matched coefficients of thermal expansion (CTEs) of the die (micro-LED element) and substrate (backplane), which is difficult to achieve in display manufacturing.

Some embodiments provide a method of fabricating a micro-LED display panel that includes soldering micro-LED elements to the display backplanes. Embodiments take advantage of the relatively high solder surface tension to pull each micro-LED element away from the wafer to the corresponding backplane contact pad, and addresses the much lower pitch of the micro-LED elements assembled on the display than on the wafer where they are fabricated. According to some embodiments, solder is patterned on the display backplane with dimensions similar to the micro-LED dimensions, but the display backplane contact pad is patterned to be larger than the micro-LED contact pads. When the solder is heated to its eutectic point, it spreads onto the backplane contact pad and pulls the micro-LED and solder away from the other micro-LEDs still on the wafer. Embodiments further enable wafer-level assembly of micro-LEDs from different wafers onto the same backplane so that monolithic fabrication of all three LED colors (red, green and blue) on one wafer is advantageously not required.

Some embodiments propose using selective laser soldering, which is particularly suitable to micro-LED bonding, to solve some challenges with soldering at fine pitch. Such a method embodiment may benefit from a unique structure of the backplane contact pads. Some embodiments use infrared laser with wavelengths of about 2000 nm and pulse widths of about 1 ns to about 1 µs, with pulse energy of about 1 nJ to about 100 nJ to perform bonding of micro-LEDs to the display backplanes. Since laser transfers thermal energy selectively only to specific micro-LEDs, any temperature limits with respect to other parts of the assembly would not be needed.

Embodiments advantageously provide a strong bonding of micro-LEDs to display backplanes and a high yielding/high throughput process that eliminates the manufacturing challenges of highly polished contacts for direct metal to metal, such as copper to copper FB or TCB. Embodiments further make possible the heterogeneous integration of non-monolithic micro-LEDs with wafer-level bonding, allowing the bonding of micro-LEDs of distinct colors from distinct wafers to the wafer in separate soldering processes instead of in a single soldering process.

Monolithic Fabrication of Micro-LED Displays

Reference is now made to FIGS. 2A-2F according to a first embodiment.

Figure 2A:
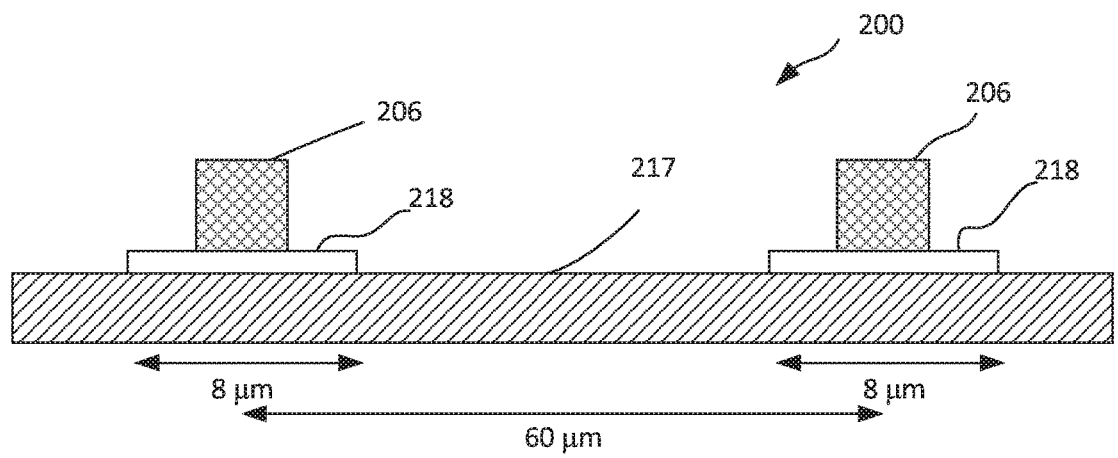
FIGS. 2A-2F are respective schematic side cross-sectional views of a source semiconductor wafer assembly and of a backplane during respective stages of transferring micro-LEDs from the wafer to the backplane according to a first embodiment involving monolithic bonding.

Referring to FIG. 2A, a backplane assembly 200 is shown including a display backplane 217 such as one that includes the pixel driver circuits fabricated using thin film transistors (not shown). The backplane in the shown example embodiment includes copper (Cu), copper nickel or other barrier metal contact pads 218 thereon, at a pitch of about 60 µm from one another, and having dimensions of 8 µm by 8 µm each by way of example for a micro-LED dimension of 4 µm by 4 µm. The backplane 217 corresponds to a display substrate. The contact pads may be patterned, along with a barrier metal layer (not shown) on the backplane 217 that covers the contact pad, for example approximately with an in-plane size of 1.5 times to 2 times the in-plane size of the micro-LED to which they are to be bonded. Furthermore, solder is then patterned onto the backplane contact pads, such as by using semi-additive (SAP) electroplating centered onto the backplane contact pads with in-plane dimensions equal to or slightly less than that of the micro-LEDs, and by way of example having a thickness that is about half the width of the contact pad, resulting in solid solder pads 206. A micro-LED width may range from about 4 µm to about 20 µm, and the solder width and thickness may be in the same size range, preferably scaling with the width of the micro-LED. It is to be noted that solder plating has been demonstrated to sizes less than 4 µm. Note that most of the challenges with bump pitch scaling to bumps less than 10 µm (pitch <20 µm) do not apply here because this application only has one die per bump, no underfill, much lower thermal and mechanical stresses, lower current, a much higher pitch (>60 µm), and wider copper contact pad so that no undercut issue would arise from a barrier/seed etch.

Figure 2B:
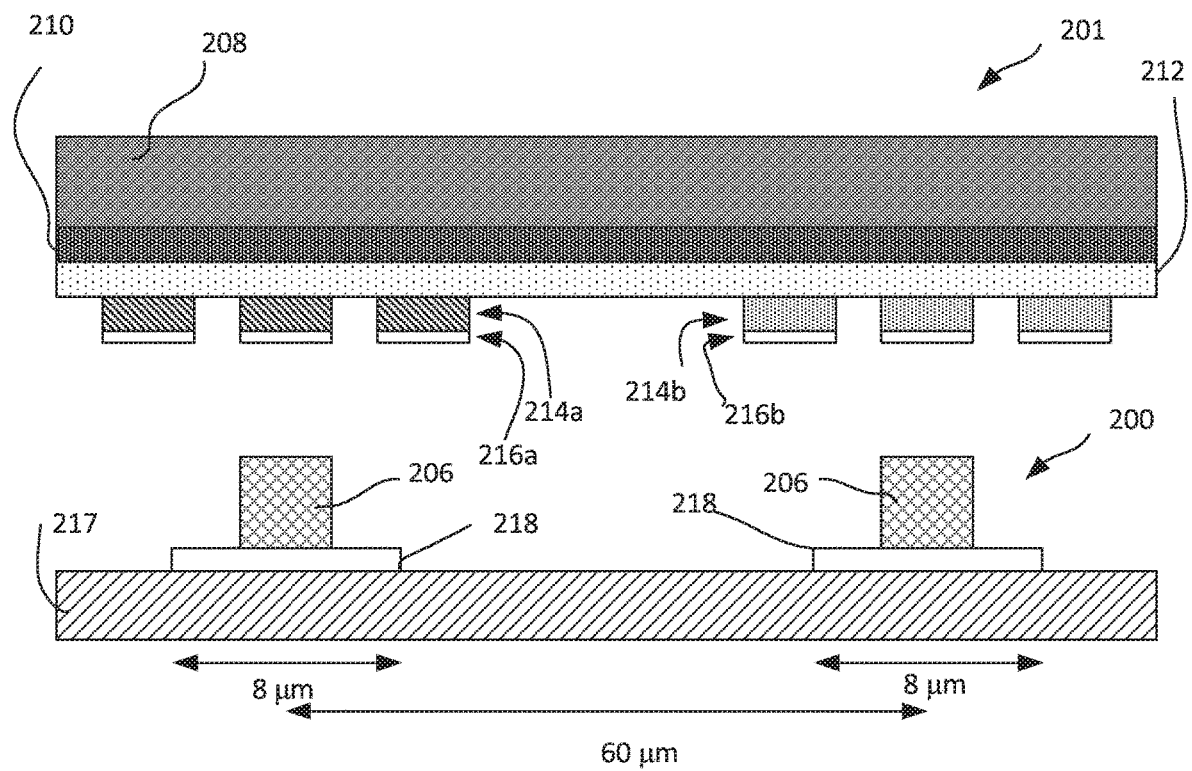

Referring now to FIG. 2B, a source semiconductor wafer assembly 201 may be aligned, according to one embodiment, with the backplane assembly 200 of FIG. 2A, for example in an environment with a vapor-phase flux, or with a non-conductive film (NCF) (not shown) applied to the display backplane 217. A source semiconductor wafer 208 of wafer assembly 201 may for example include silicon or sapphire or any other suitable semiconductor material. Aligning the backplane and the source semiconductor wafer with one another is done such that each of at least some of the plurality of micro-LED contact pads 216a and 216b are in registration with a corresponding one of the solder pads 206.

Wafer assembly 201 may further include a nucleation layer 210, such as one made of AlN, or any other suitable nucleation layer material, and a release layer 212, such as one made of a metal nitride, for example TiN. The wafer assembly 201 further includes blue micro-LEDs 214a and red micro-LEDs 214b, and copper micro-LED contact pads 216a and 216b. By way of example, a micro-LED size for soldering bonding to a display according to some embodiments may include an in-plane size of about 4 µm×4 µm and a thickness of about 1 µm with a pitch of about 5 µm. The solder may have dimensions of about 4 µm×4 µm×4 µm and the backplane contact pads may have in plane dimensions of 8 µm×8 µm. The contact pads may be patterned onto each of the micro-LEDs and onto the display backplane using well-known methods.

Figure 2C:
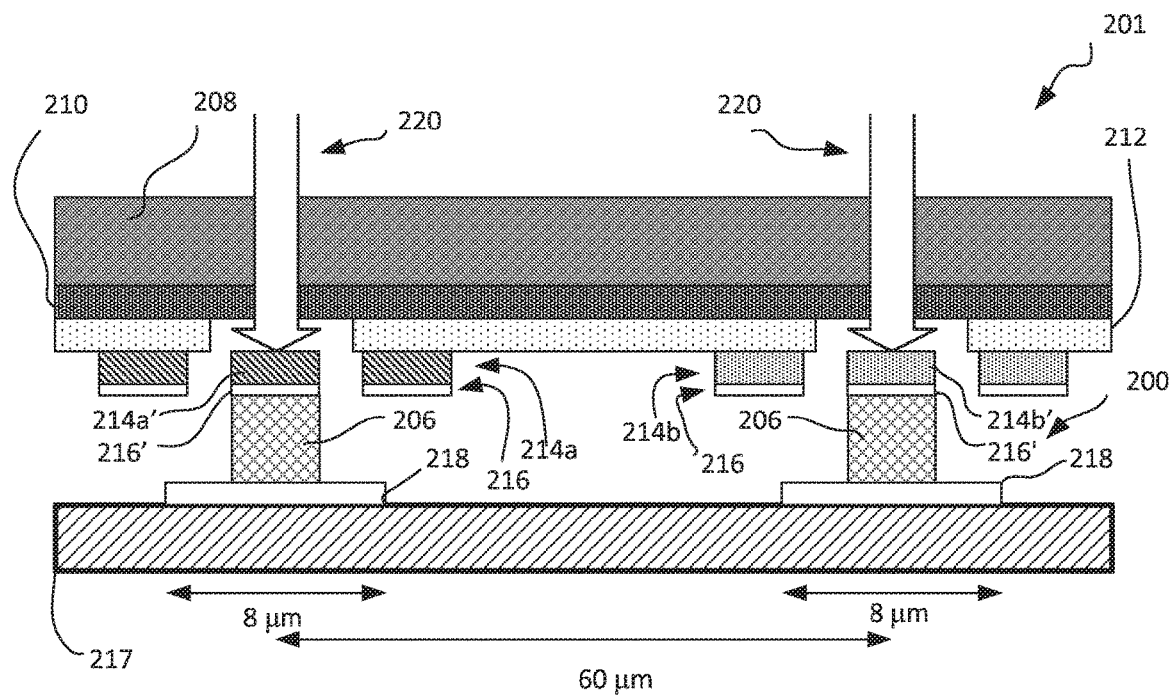

Referring next to FIG. 2C, the wafer assembly 201 and the backplane assembly 200 may be brought together so as to establish contact between the micro-LED contact pads 216' of a blue micro-LED 214a' and of a red micro-LED 214b' on the one hand, and the solder 206 on the corresponding backplane contact pads 218 on the other hand. Thereafter, an infra-red (IR) laser pulse or IR laser radiation 220 may be applied to the contact pads 216' and 218 as shown, in this way ablating the release layer 212 locally at the location of the application of the IR laser pulse 220 and releasing the micro-LED's 214a' and 214b' from the wafer assembly 201 and onto the solder pads 206. The IR laser pulse may comprise an approximately 2000 nm, 3 ps, 3 µJ pulse. The IR laser may also use, by way of example, a 1 to 10 µJ pulse at 1 ps to 10 ps.

Figure 2D:
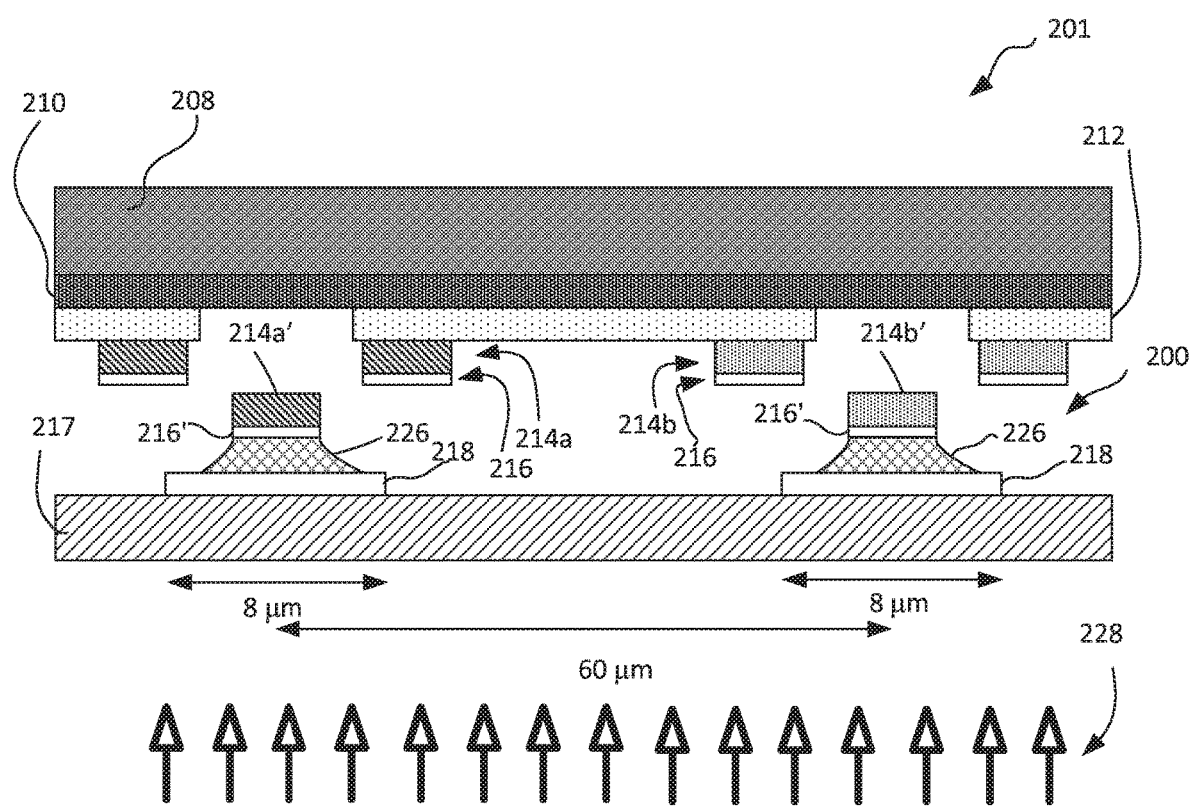

Referring next to FIG. 2D, the display backplane 217 may be subject to heat 228 through the display backplane 217 according to one embodiment in a standard TCB tool. The solid solder pads 206 melt into flowing solder 226 and spread on the underlying contact pad on the display backplane as shown. The melting of the solder pads from the IR pulse application 220 pulls the micro-LEDs 214a' and 214b' down away from the adjacent micro-LEDs 214a and 214b that are still attached to the release layer of the wafer assembly 201, and this pulling away advantageously prevents solder contact with other LEDs still on the wafer assembly 201. Note that the pitch between micro-LEDs on the backplane may be 40 µm for quad high definition (QHD) resolution and a 13.3" diagonal display, and embodiments would still work under such a scenario.

Figure 2E:
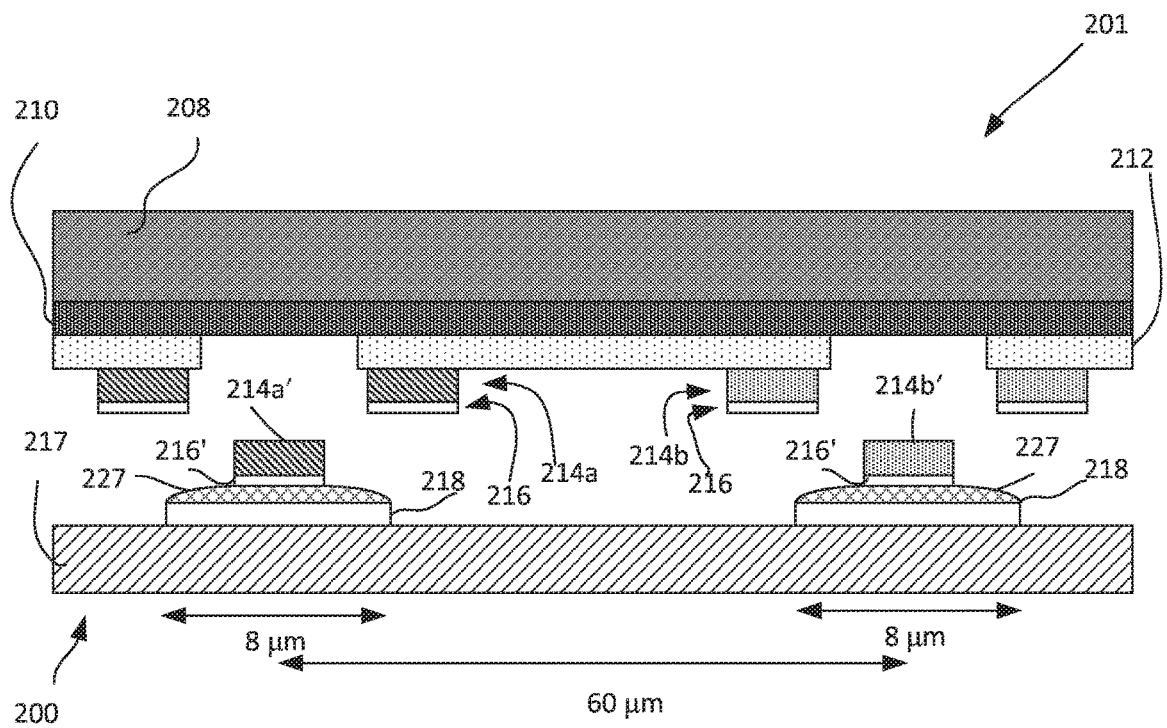

Referring to FIG. 2E, a finished display structure for the backplane assembly 200 is shown including blue micro-LED 214a' and red micro-LED 214b' bonded to the backplane contact pads 218 of the display backplane 217 by way of solder pads 227. The heat applied by way of the display backplane 217 may further pull the solder down to a final thickness, for example a thickness of about 1 micron for a 8 micron by 8 micron copper pad with a 4 micron by 4 micron by 4 micron initial plated solder. Each of the solder pads 227 is shown in the final product as bonding respective ones of the at least some of the plurality of micro-LEDs to a corresponding one of the plurality of backplane contact pads, each of the solder pads further extending on said corresponding one of the plurality of backplane contact pads beyond a footprint thereon of said one of the plurality of the micro-LEDs. Essentially, the solder material of solder pads 227 in the finished display extend beyond a projection of the surface area of the micro-LED contact pads onto the surface area of the backplane contact pads.

It is noted that embodiments are clearly not limited to the transfer of only blue and red micro-LEDs onto a display backplane, and include within their scope of transfer and bonding of micro-LEDs of different colors to a display backplane according to a first embodiment as noted above, which pertains to monolithic bonding of micro-LEDs to a display backplane, where different color micro-LEDs to be bonded to the display backplane are bonded at the same time, as opposed to a non-monolithic fabrication method where micro-LEDs of different colors are transferred and bonded onto the display backplane at different times.

Referring back to FIG. 2D, recall that the flowing solder 226 was melted into its final configuration as shown in FIG. 2E using non-localized heating of the backplane across a surface thereof opposite its surface carrying contact pads thereon, for example using TCB. According to an alternative embodiment for the first embodiment involving a monolithic bonding of micro-LED contact pads, instead of using non-localized heating of the display backplane, one variation involves using a localized heating involving a second round of laser pulses to the micro-LEDs in order to melt the solder instead of using a global heating of the display backplane in order to do so. This variation of the first embodiment is shown in FIG. 2F.

Figure 2F:
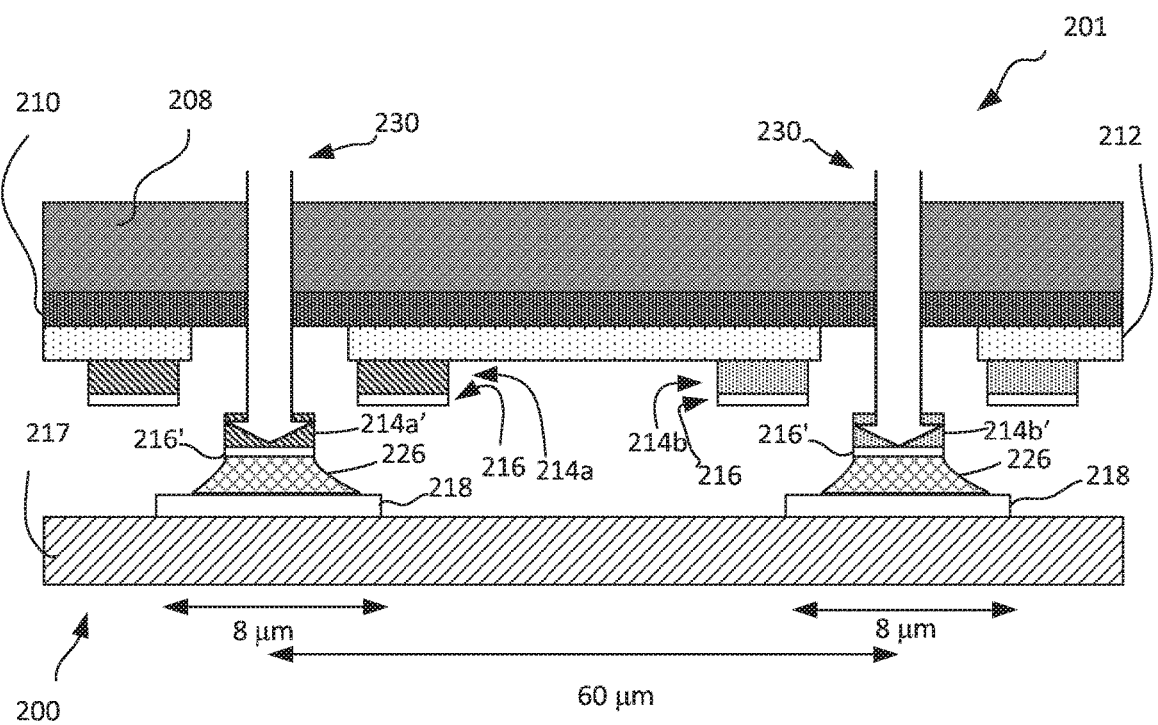

In the context of FIG. 2F, with laser soldering, the process is similar to that shown for FIGS. 2B-2D, except for the last step in FIG. 2D, where, instead of global heating of the display backplane, the solder heating is completed using an infrared (IR) laser radiation 230 (e.g. 2000 nm, 1 ns-1 μs pulse, 1 nJ-100 nJ pulse), which is absorbed by the micro-LED metal contact at the solder interface to locally heat the solder under the micro-LEDs. It is to be noted that the micro-LEDs are transparent to IR, except for the contact metal that needs to absorb the IR laser energy to heat up the contact and form the bond.

A laser with wavelength of about 2000 nm, a pulse width of about 1 ns-1 μs, and a pulse energy of about 1 nJ to 100 nJ may be used. The 2000 nm laser beam may be transmitted through the wafer 208 and nucleation layer 210 and transfer its energy to the solder structure causing a localized heating of the solder structure and a melting thereof to effect local bonding with micro-LED structures 214a' and 214b'. Other infrared lasers can also be used such as a 5000 nm wavelength CO laser.

The variation of using laser heating and melting the solid solder pads 206 addresses some of the challenges with the global heating of the display backplane. Laser soldering is a technique where a precisely focused laser beam provides controlled heating of the solder pads, leading to fast and localized formation of an electrical joint or coupling. The ease of controlling the shape and location of the heating area leads to reliable solder joints with minimal component heating and is well suited to high density packaging. Of particular importance to very fine pitch soldering and micro-LEDs, some advantages of laser soldering include potentially preventing intermetallic compound (IMC) formation between the solder and contact pad metal such as Cu because thermal diffusion is much faster than atomic diffusion. For example, the tin in tin silver copper (SAC) solder may react with copper or nickel in the contact pads to form alloys, which may make the solder brittle and susceptible to shear in the event of mechanical stresses of certain magnitudes. However, thermal diffusivity in metals is order 1 cm²/s, which is many orders of magnitude higher than the intermetallic diffusivities that lead to intermetallic compound formation. The thermal diffusion time to completely heat micro-LED contacts/solder pads with a thickness of about 1-10 μm thick is about 100 ns to 1 μs, which dictates the laser pulse time required. Cooling occurs through the display backplane glass and the characteristic time is 2 orders of magnitude higher at about 10 to 100 μs. However, mass diffusivity of copper in molten tin silver copper (SAC) solder is about $10^{-4}$ cm²/s, which yields 1-10 ms for IMC formation, 2 orders of magnitude longer than the time required to heat the solder pads. Therefore, IMC formation within the solder can be substantially prevented through the use of laser soldering. A finished product of laser soldering may still have the form shown in FIG. 2E or F, but with some exceptions to the composition of at least the solder bonding the contact pads together. A result of laser heating the flowing solder 226 of FIG. 2D would be to achieve final solder pads 227 in FIG. 2E where more than about 50% of the thickness of the solder material (as measured from a contact pad 218 on the display backplane 217 to a contact pad 216' of a micro-LED 214a'/214b') is substantially at its original composition, that is, at the composition of the solder at a time of its patterning onto the display backplane 217. For example, according to one embodiment, about 50% or more of the solder's thickness may exhibit a composition that matches the original composition of the solder by about 90% to about 95%, or a composition that is from about 90% to about 95% free of intermetallic compounds (IMC).

Another advantage of laser soldering, an example of which is shown in FIG. 2F, is obviating issues caused by a CTE mismatch between the backplane, typically made of glass, and the wafer, typically made of silicon. Because the solder heating by way of laser is localized and uses nanosecond to microsecond laser pulses, it does not cause the type of differential material expansion as between the wafer assembly 201 on the one hand, and the backplane assembly 200 on the other hand (by virtue of the coefficient of thermal expansion (CTE) mismatch between the two) that is typically caused by a global heating process as described for example in the context of FIG. 2D. When using laser soldering, there are therefore advantageously substantially no alignment issues from the CTE mismatch between the die and the substrate.

Yet another advantage of laser soldering includes the use of focused optics which allows soldering in small spaces of fine pitched components. The availability of motorized optics further optimizes the focal point for each joint. In addition, the high level of automation of the laser soldering system results in a very repetitive and reproducible process.

Referring now back to FIG. 2C, after laser release from application of IR laser pulses 220, the micro-LEDs 214a' and 214b' along with contact pads 216' will be in contact or near contact with the wafer assembly (or some surfaces of the nucleation layer 210 and any remnants from the ablation of the release layer 212) above it and bound by Van der Waals forces to the wafer assembly. It is noted that for clarity of illustration, the latter phenomenon is not depicted in FIG. 2C for the clarity of illustrating the IR laser pulses 220 ablating the release layer to release the micro-LEDs 214a' and 214b' from the wafer assembly 201. However, the release layer typically has a thickness that is about 20 to about 100 times smaller than that of the micro-LEDs 214a' and 214b' being released, the release layer typically having a thickness of about 10 nm to about 50 nm, and this could not be clearly shown to scale in the figures. The ablation of release layer 212, and the resulting release of micro-LEDs 214a' and 214b' would result in the micro-LEDs 214a' and 214b' being in contact or in near contact with corresponding surfaces of the wafer assembly 201 and bound by Van der Waals forces thereto, typically Van der Waals forces between the micro-LED encasing material and the material of the wafer, such as Si or the nucleation layer. We should consider the strength of these forces holding the micro-LEDs (mostly encased in an encasing material such as SiO2) to the wafer assembly 201 relative to the solder force pulling downward on the LED from surface tension toward the backplane assembly 200, which solder force must be stronger than the Van der Waals force. The Van der Waals force $F_v$ between the two flat surfaces of a square micro-LED and wafer assembly may be obtained from Equation 1 below:

$$F_v = \frac{AS}{6\pi D^3} = \frac{Aw^3}{6\pi D^3} \qquad \text{Eq. (1)}$$

where:
S is the surface area in contact or near contact;
w is the width of a square micro-LED;
D is the distance between the surfaces; and A is the Hamaker constant, which is about 1e-19 J for all condensed phases.

The force on the micro-LED from solder surface tension $F_s$ during solder spreading on the pad can be estimated as using Equation 2 below:

$$F_s = 2\pi R\gamma = 2\pi w\gamma \qquad \text{Eq. (2)}$$

where:
  $\gamma$ is the solder surface tension; and
  R is the solder radius.

According to one embodiment, R may be approximately equal to the micro-LED width w. The bonding force from the solder surface tension decreases with solder size, which scales based on the micro-LED size, but this scaling is linear in the solder radius/micro-LED width, while the Van der Waals force between the micro-LED and the wafer assembly scales based on the micro-LED width squared, and so decays faster as the micro-LED size is decreased, making the process more favorable with a scaling down of the system size.

Figure 3:
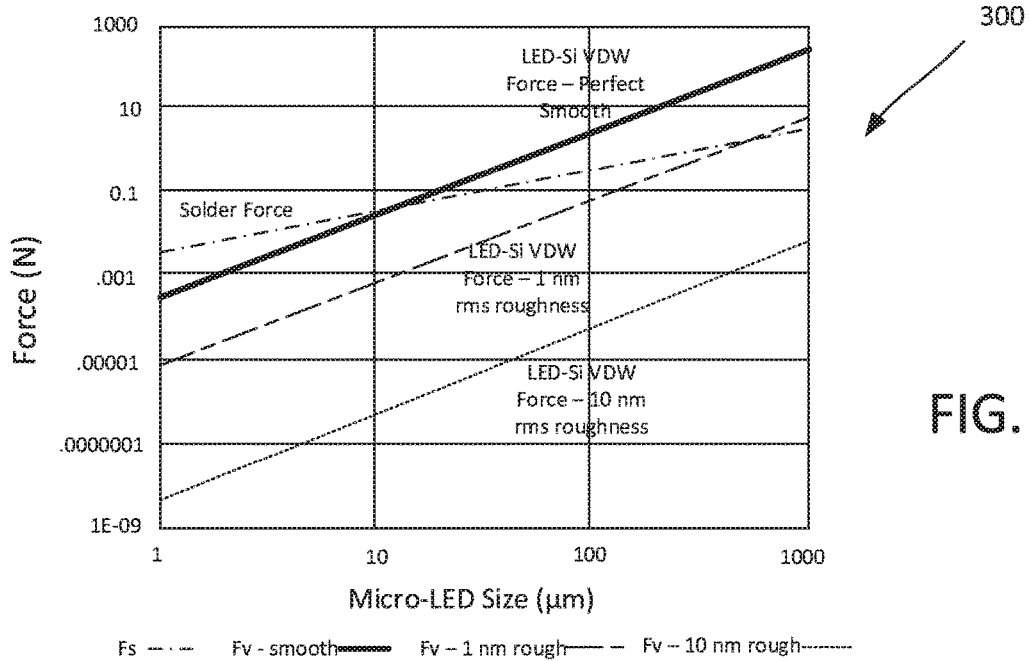
FIG. 3 is a graph plotting Van der Waal forces between micro-LEDs and a source semiconductor wafer.

FIG. 3 shows a graph 300 plotting $F_v$ forces in Newtons as a function of micro-LED size (w) in µm with $F_v$ plotted for 3 different separation distances between a micro-LED surface and a Si surface of a Si wafer expressed in terms of the smoothness of the micro-LED surface in contact with the Si wafer. The graph shown is for various surface roughnesses, and the force on the LED from the solder surface tension ("solder force"). As far as A from Equation 1 above, for SiO2-SiO2, A is 0.6e-19 J and for Si—Si, A is 2e-19 J. Therefore, to arrive at the plots of FIG. 3, we have approximated A for SiO2-Si as 1.3e-19 J. Solder surface tension used for plotting the graphs in FIG. 3 is 550 mJ/m (taken for Sn at its melting point). For perfectly smooth surfaces, D from Equation 1 above is one bond length, about 0.3 nm, and this level of smoothness results in the maximum possible Van der Waals force between the wafer-facing surface of the micro-LED the facing surface of the Si wafer. As FIG. 3 suggests, this force becomes smaller than the solder force from surface tension for micro-LEDs smaller than 10 µm, and this is for very smooth micro-LED surfaces. However, the wafer-facing surface of the micro-LED is known to not be smooth, as a roughness for the same on the order of at least 10 nm has been observed. After micro-LED laser release as explained in relation to FIGS. 2A-2E, and as described in the context of FIG. 2C, the roughness of the wafer-facing surface of the micro-LED results in an increase in the mean separation distance D, which can be approximated by the Ra roughness value of the wafer-facing surface. As seen in FIG. 3, even for 1 nm rms roughness of the wafer-facing surface, the Van der Waals force holding the micro-LED to the Si is reduced below the solder force for a micro-LED size of up to 200 µm. As further seen in FIG. 3, with a 10 nm rms roughness of the wafer-facing surface, the solder force dominates up to at least the mm-scale. Therefore, we expect that, as suggested in FIG. 3, for micro-LEDs having dimensions in the range of 4-20 µm, the solder force pulling the LED off the Si will dominate.

Wafer-Level Bonding for Non-Monolithic Fabrication of Micro-LED Displays

The solder bonding method disclosed here enables wafer-level bonding of micro-LEDs fabricated on different wafers onto the same backplane. Therefore, with the process embodiments as described herein, the micro-LEDs do not need to be fabricated monolithically with all three color micro-LEDs initially on the same wafer in order to assemble a micro-LED display.

Reference is now made to FIGS. 4A-4G according to a second embodiment.

Figure 4A:
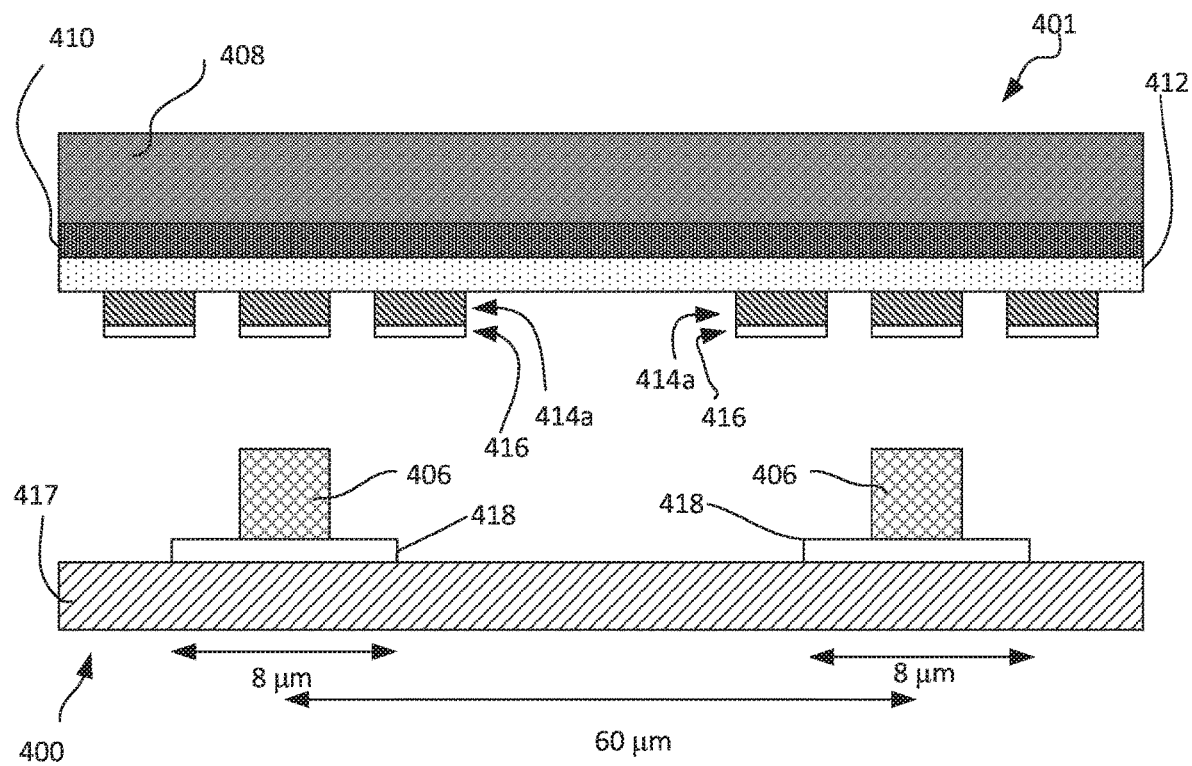
FIGS. 4A-4G are respective schematic side cross-sectional views of various source semiconductor wafer assemblies and of a backplane during respective stages of transferring micro-LEDs from the wafers to the backplane according to a second embodiment involving non-monolithic wafer-level bonding.

FIG. 4A is similar to FIG. 2B, with like reference numerals referring to like components, except that, in FIG. 4A, the wafer assembly 400 includes single color micro-LEDs, such as blue micro-LEDs 414a, thereon.

Referring to FIG. 4A, which is similar to FIG. 2B, except that only blue micro-LEDs are provided on the wafer assembly, a display substrate corresponding to a backplane assembly 400 is shown including a display backplane 402 such as one that includes the pixel driver circuits fabricated using thin film transistors (not shown). The backplane in the shown example embodiment includes backplane copper (Cu), copper nickel or other barrier metal contact pads 404 therein, at a pitch of about 60 µm from one another, and having dimensions of 8 µm by 8 µm each by way of example for a micro-LED dimension of 4 µm by 4 µm. The contact pads may be patterned, along with a barrier metal layer (not shown) on the backplane 402, for example approximately with an in-plane size of 1.5 times to 2 times the in-plane size of the micro-LED to which they are to be bonded. Furthermore, solder is then patterned onto the backplane contact pads, such as by using semi-additive (SAP) electroplating centered onto the backplane contact pads with in-plane dimensions equal to or slightly less than that of the micro-LEDs, and by way of example having a thickness that is about 2 to about 4 times the thickness of the micro-LED, resulting in solid solder blocks 406. A micro-LED width may range from about 4 µm to about 20 µm, and the solder width and thickness may be in the same size range, preferably scaling with the width of the micro-LED. It is to be noted that solder plating has been demonstrated to sizes less than 4 µm. Note that most of the challenges with bump pitch scaling to bumps less than 10 µm (pitch <20 µm) do not apply here because this application only has one die per bump, no underfill, much lower thermal and mechanical stresses, lower current, a much higher pitch (>60 µm), and wider copper contact pad so that no undercut issue would arise from a barrier/seed etch.

Referring still to FIG. 4A, a source semiconductor wafer assembly 401 including only blue micro-LEDs 414a may be aligned, according to one embodiment, with the backplane assembly 400, for example in an environment with a vapor-phase flux, or with a non-conductive film (NCF) (not shown) applied to the display backplane 417 Aligning the backplane and the source semiconductor wafer with one another is such that each of at least some of the plurality of micro-LED contact pads is in registration with a corresponding one of the solder pads A source semiconductor wafer 408 of wafer assembly 401 may for example include silicon or sapphire or any other suitable semiconductor material. Wafer assembly 401 may further include a nucleation layer 410, such as one made of AlN, or any other suitable nucleation layer material, and a release layer 412, such as one made of a metal nitride, for example TiN. The wafer assembly 401 further includes blue micro-LEDs 414a, and copper micro-LED contact pads 416. By way of example, a micro-LED size for soldering bonding to a display according to some embodiments may include an in plane size of about 4 µm× about 4 µm and a thickness of about 1 µm with a pitch of about 5 µm. The solder may have dimensions of about 4 µm× about 4 µm× about 4 µm and the backplane contact pads may have in plane dimensions of about 8 µm× about 8 µm. The contact pads may be patterned onto each of the micro-LEDs and onto the display backplane using well-known methods.

Figure 4B:
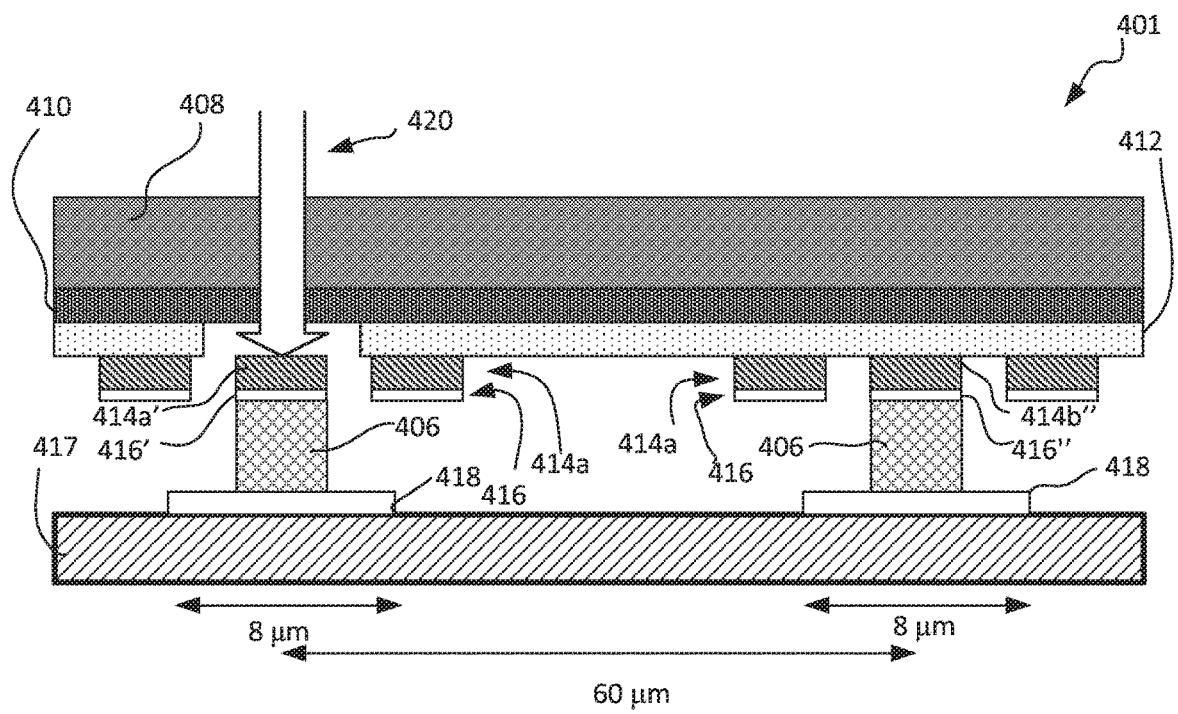

Referring next to FIG. 4B, which is similar to FIG. 2C, except that not all of the backplane contact pads 418 are about to receive a micro-LED thereon, the wafer assembly 401 and the backplane assembly 400 may be brought together so as to establish contact between the micro-LED contact pad 416' of a blue micro-LED 414a' and contact pad 416" of a blue micro-LED 414a" on the one hand, and corresponding solder 406 on the backplane contact pads 418 on the other hand. Thereafter, an infra-red (IR) laser pulse or IR laser radiation 420 may be applied to the microLED 414a' as shown, in this way ablating the release layer 412 locally at the location of the application of the IR laser pulse 420 and releasing the micro-LED 414a' from the wafer assembly 401 and onto the solder 406. The IR laser pulse may comprise a 2000 nm, 3 ps, 30 µJ pulse. The IR laser may also use, by way of example, a 1 to 10 µJ pulse at 1 ps to 10 ps.

Figure 4C:
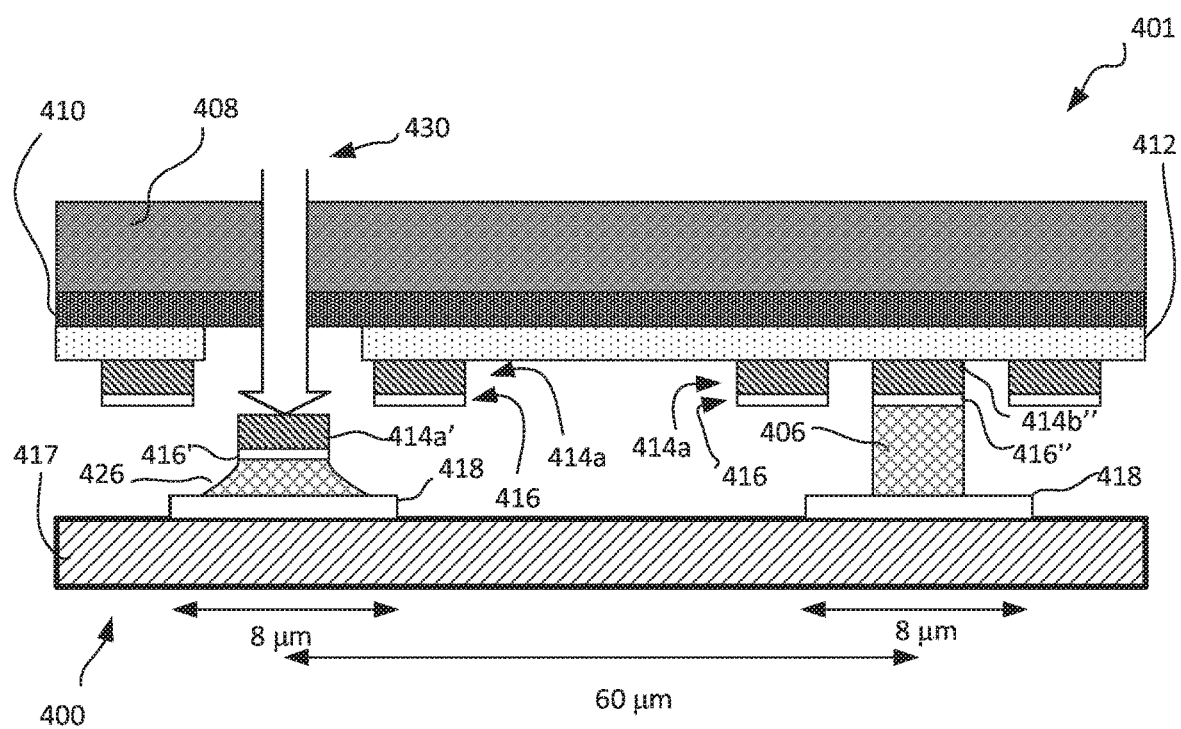

Reference is now made to FIG. 4C, which is similar to FIG. 2F, except that laser soldering is applied only to the solder 406 in contact with the released micro-LED 414a'. Here again, a second round of laser pulses to the micro-LED is used in order to melt the solder instead of using a global heating of the display backplane in order to do so. The solid solder 406 melts into solder 426 and spreads on the underlying contact pad on the display backplane as shown. Global heating as depicted by way of example in FIG. 2D in the case of non-monolithic bonding of micro-LEDs to a display backplane would not be advantageous, in that it could lead to a melting of the solid solder 406 under a micro-LED that is still attached to wafer assembly 201. The solder heating is completed using an infrared laser (e.g. 2000 nm, 1 ns-1 µs pulse, 1 nJ-100 nJ pulse), which is absorbed by the micro-LED metal contact at the solder interface to locally heat the solder under the micro-LEDs. It is to be noted that the micro-LEDs are transparent to IR, except for the contact metal 416' that needs to absorb the IR laser energy to heat up the contact and form the bond.

A laser with wavelength of about 2000 nm, a pulse width of about 1 ns-about 1 µs, and a pulse energy of about 1 nJ to about 100 nJ may be used. The about 2000 nm laser beam or radiation may be transmitted through the wafer 408 and nucleation layer 410 and transfer its energy to the solder structure causing a localized heating of the solder structure and a melting thereof to effect local bonding with micro-LED structure 414a'. Other infrared lasers can also be used such as a 5000 nm wavelength CO laser.

The melting of the solder from the IR pulse application 420 pulls the micro-LED 414a' down away from the adjacent micro-LEDs 414a that are still attached to the release layer of the wafer assembly 401, and this pulling away advantageously prevents solder contact with other LEDs still on the wafer assembly 401. The final height/thickness of the bonded blue micro-LEDs is less than the height of the unheated solder 406, which enables subsequent wafer-level alignment and bonding of micro-LEDs from another wafer without affecting the already bonded blue micro-LEDs. Because the solder pitch on the display backplane (>60 µm) is much greater than that on the micro-LED wafer (4-20 µm), the laser heating of each solder joint should not affect the others. For example, the thermal diffusion length in the glass of the display backplane is ~1 µm for a laser pulse time of 1 µs, and even if propagated through Si, it is 10 µm, and so it would not heat the solder 60 µm away. Note that the pitch between micro-LEDs on the backplane may be 40 µm for quad high definition (QHD) resolution and a 13.3" diagonal display, and embodiments would still work under such a scenario.

Figure 4D:
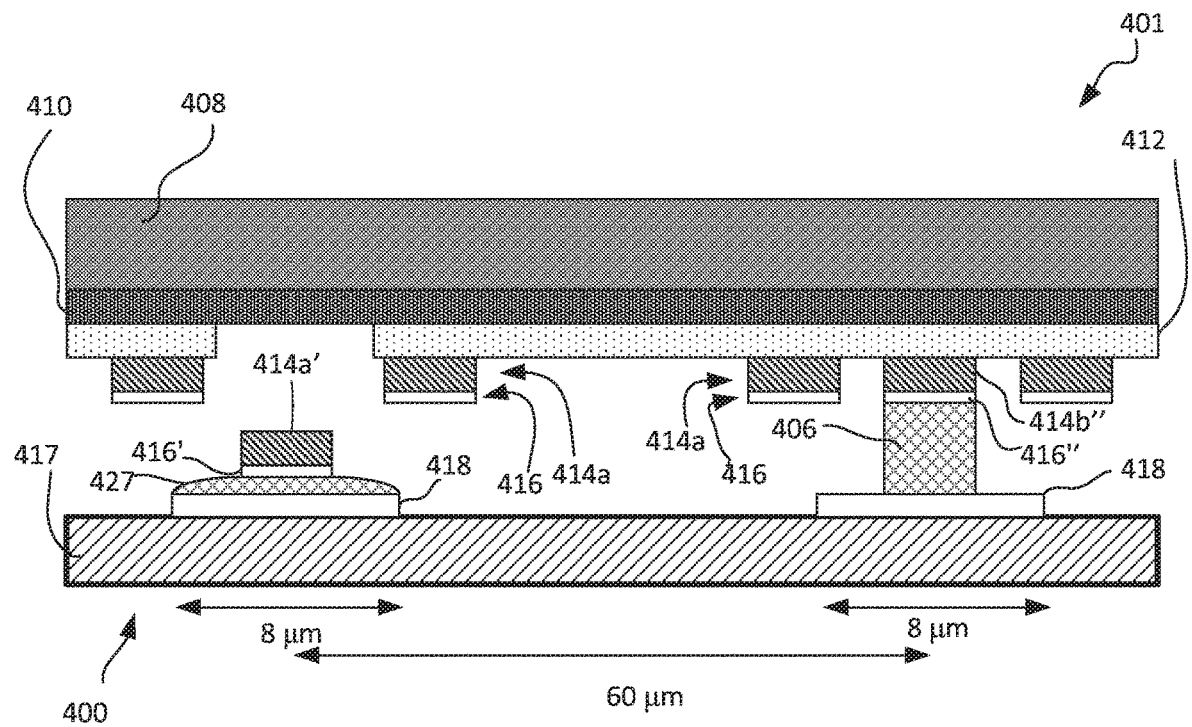

Referring to FIG. 4D, which is similar to FIG. 2E, except for the fact that only one type of micro-LED, blue micro-LED 414a' is shown as being bonded to the display backplane 417. The heat applied by way of laser soldering may further pull the solder 427 down to a final thickness as shown.

Figure 4E:
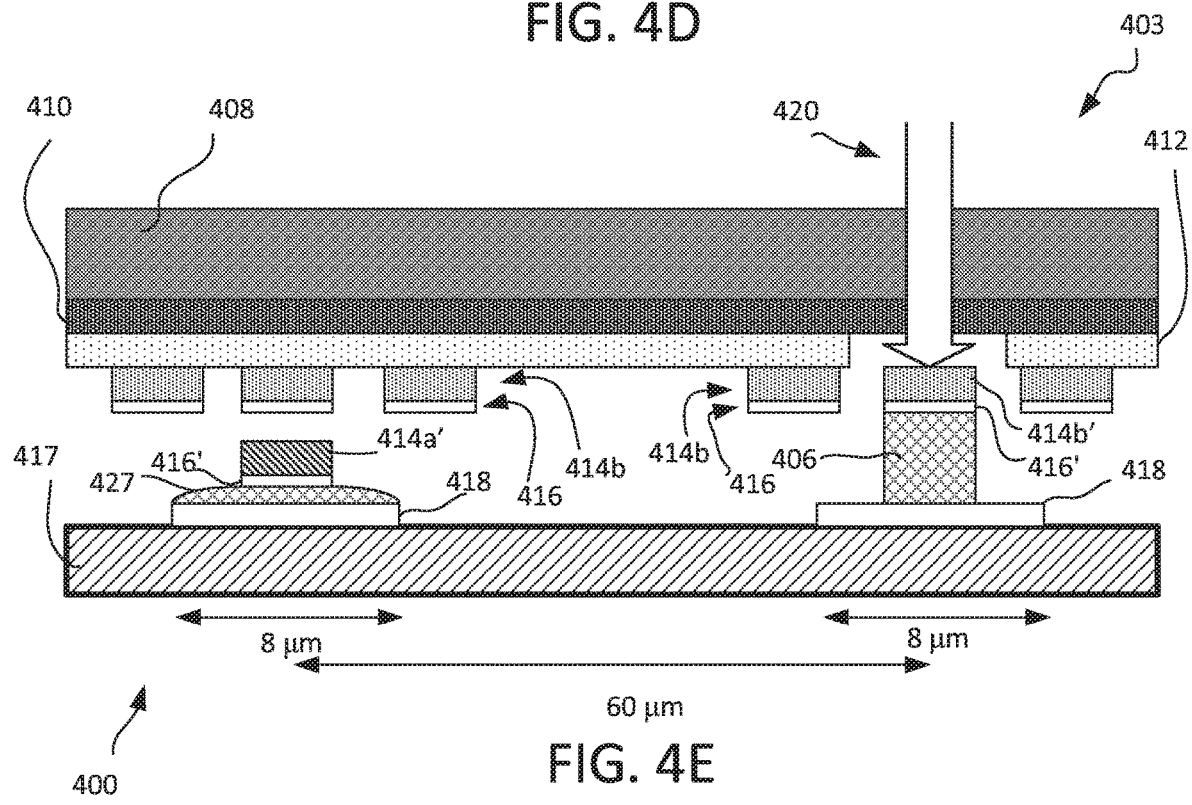

Referring now to FIG. 4E, a new wafer assembly 403 including only red micro-LEDs 414bs thereon and the backplane assembly 400 may be brought together so as to establish contact between the micro-LED contact pad 416' of a red micro-LED 414b' and the solder 406 on the corresponding backplane contact pad 418 on the other hand. Thereafter, an infra-red (IR) laser pulse 420 may be applied to the release layer 412 behind microLED 414b' as shown, in this way ablating the release layer 412 locally at the location of the application of the IR laser pulse 420 and releasing the micro-LED 414b' and from the wafer assembly 403 and onto the solder 406. The IR laser pulse may comprise a 2000 nm, 3 ps, 3 µJ pulse. The IR laser may also use, by way of example, a 1 to 10 µJ pulse at 1 ps to 10 ps.

Figure 4F:
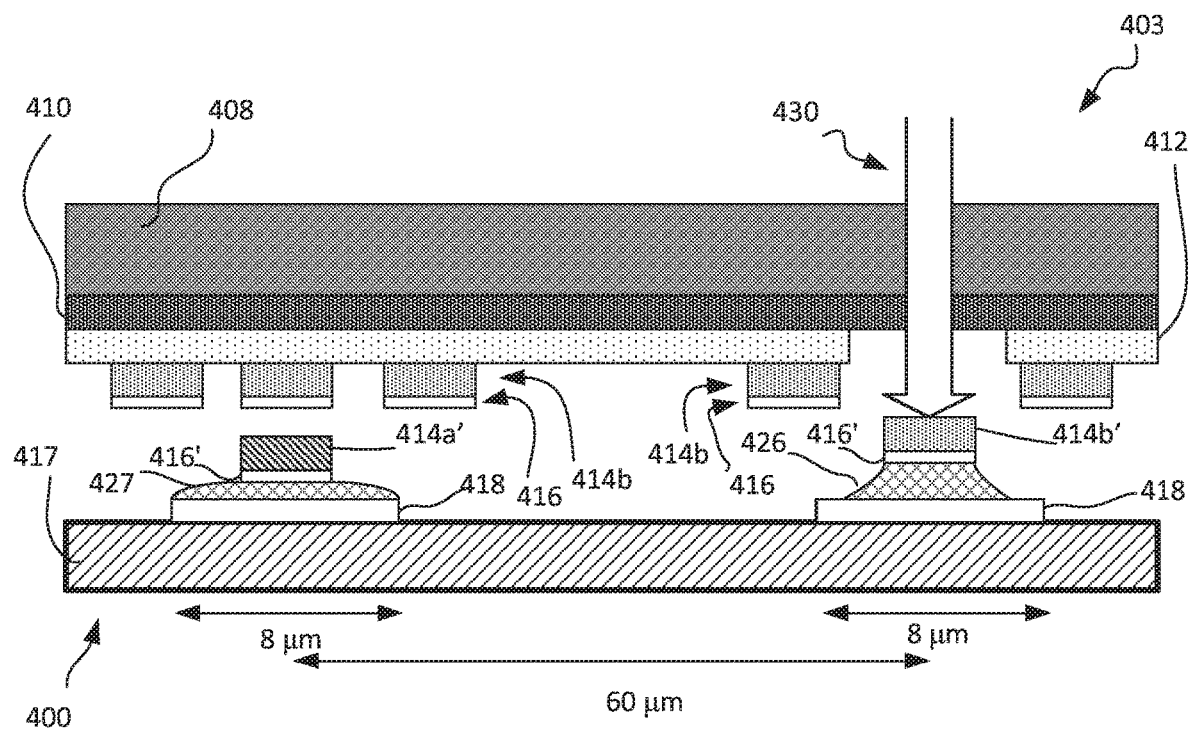

Reference is now made to FIG. 4F, which is similar to FIG. 2F, except that laser soldering is applied only to the solder in contact with the released micro-LED 414b'. Here again, another round of laser pulses to the micro-LED is used in order to melt the solder instead of using a global heating of the display backplane in order to do so. Global heating in the case of non-monolithic bonding of micro-LEDs to a display backplane would in any event not be advantageous, in that it could lead to a melting of the solid solder 406 under a micro-LED that may be still attached to wafer assembly 403. The solder heating is completed using an infrared laser (e.g. 2000 nm, 1 ns-1 µs pulse, 1 nJ-100 nJ pulse), which is absorbed by the micro-LED metal contact at the solder interface to locally heat the solder under the micro-LEDs. The solid solder 406 melts into solder 426 and spreads on the underlying copper pad on the display backplane as shown. It is to be noted that the micro-LEDs are transparent to IR, except for the contact metal that needs to absorb the IR laser energy to heat up the contact and form the bond.

A laser with wavelength of about 2000 nm, a pulse width of about 1 ns-about 1 µs, and a pulse energy of about 1 nJ to about 100 nJ may be used. The about 2000 nm laser beam may be transmitted through the wafer 408 and nucleation layer 410 and transfer its energy to the microLED contact pad 416', causing a localized heating of the solder structure and a melting thereof to effect local bonding with micro-LED structure 414b'. Other infrared lasers can also be used such as a 5000 nm wavelength CO laser.

The melting of the solder from the IR pulse application 420 pulls the micro-LED 414b' down away from the adjacent micro-LEDs 414b that are still attached to the release layer of the wafer assembly 403, and this pulling away advantageously prevents solder contact with other LEDs still on the wafer assembly 403. Note that the pitch between micro-LEDs on the backplane may be 40 µm for quad high definition (QHD) resolution and a 13.3" diagonal display, and embodiments would still work under such a scenario.

Figure 4G:
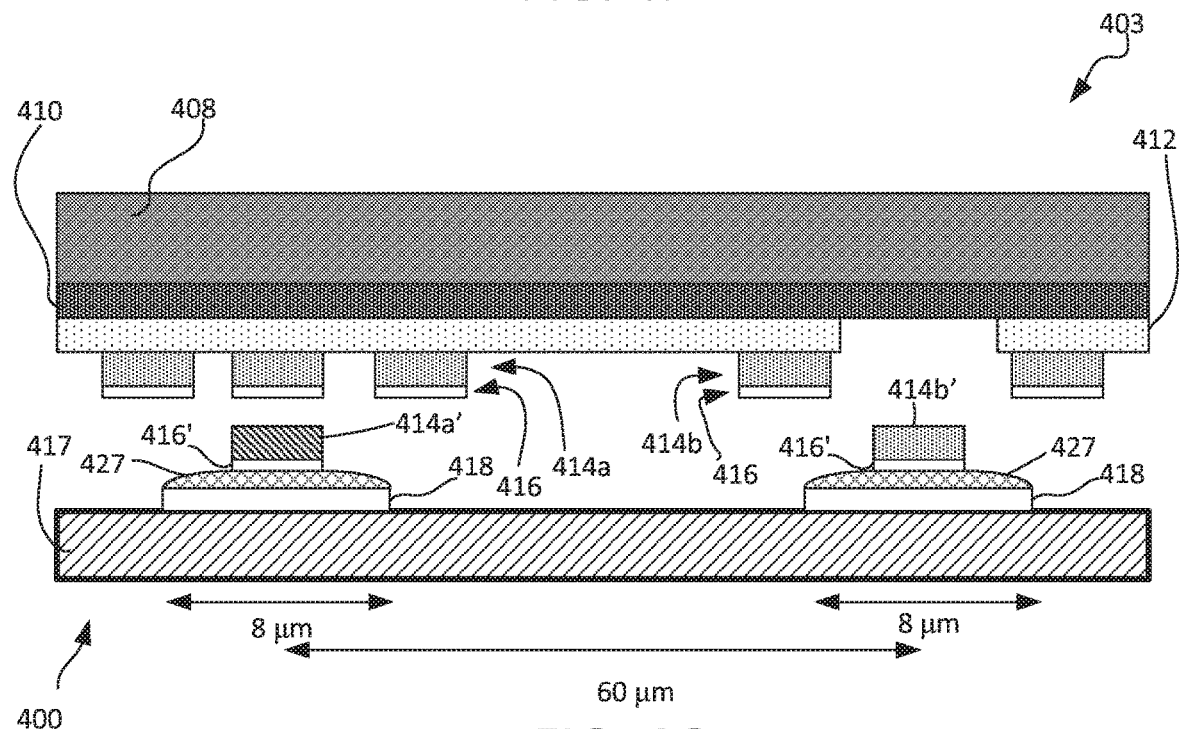

Referring to FIG. 4G, a finished display structure for the backplane assembly 400 is shown including blue micro-LED 414a' and red micro-LED 414b' bonded to the backplane contact pads 418 of the display backplane 417 by way of solder pads 427. The heat applied may pull the solder down to a final thickness, for example a thickness of about 1 micron for a 8 micron by 8 micron copper pad with a 4 micron by 4 micron by 4 micron initial plated solder. Each of the solder pads 427 is shown in the final product as bonding respective ones of the at least some of the plurality of micro-LEDs to a corresponding one of the plurality of backplane contact pads, each of the solder pads further extending on said corresponding one of the plurality of backplane contact pads beyond a footprint thereon of said one of the plurality of the micro-LEDs. Essentially, the solder material of solder pads 427 in the finished display extend beyond a projection of the surface area of the micro-LED contact pads onto the surface area of the backplane contact pads.

It is noted that embodiments are clearly not limited to the non-monolithic transfer of only blue and red micro-LEDs onto a display backplane, and include within their scope of transfer and bonding of micro-LEDs of different colors to a display backplane according to a second embodiment as noted above, which pertains to non-monolithic bonding of micro-LEDs to a display backplane, where different color micro-LEDs to be bonded to the display backplane are bonded from respective wafer assemblies at different times.

In accordance with one or more embodiments of the present disclosure, a method of manufacturing a micro-light emitting diode (LED) display includes aligning a display backplane and a source semiconductor wafer. A plurality of backplane contact pads of a first width are fixed to the backplane and include first solder pads thereon with a second width smaller than the first width. The wafer includes thereon a plurality of micro-LEDs, and a plurality of micro-LED contact pads fixed to the micro-LEDs and having a third width smaller than the first width. The method further includes: aligning such that at least some of the micro-LED contact pads register with corresponding first solder pads; releasing at least some of the micro-LEDs from the wafer onto corresponding first solder pads; and forming a plurality of second solder pads by melting the corresponding first solder pads. The second solder pads bond the at least some of the micro-LEDs to corresponding ones of the plurality of backplane contact pads, the second solder pads further extending on said corresponding ones of the plurality of backplane contact pads beyond a footprint thereon of said some of the micro-LEDs.

Figure 5:
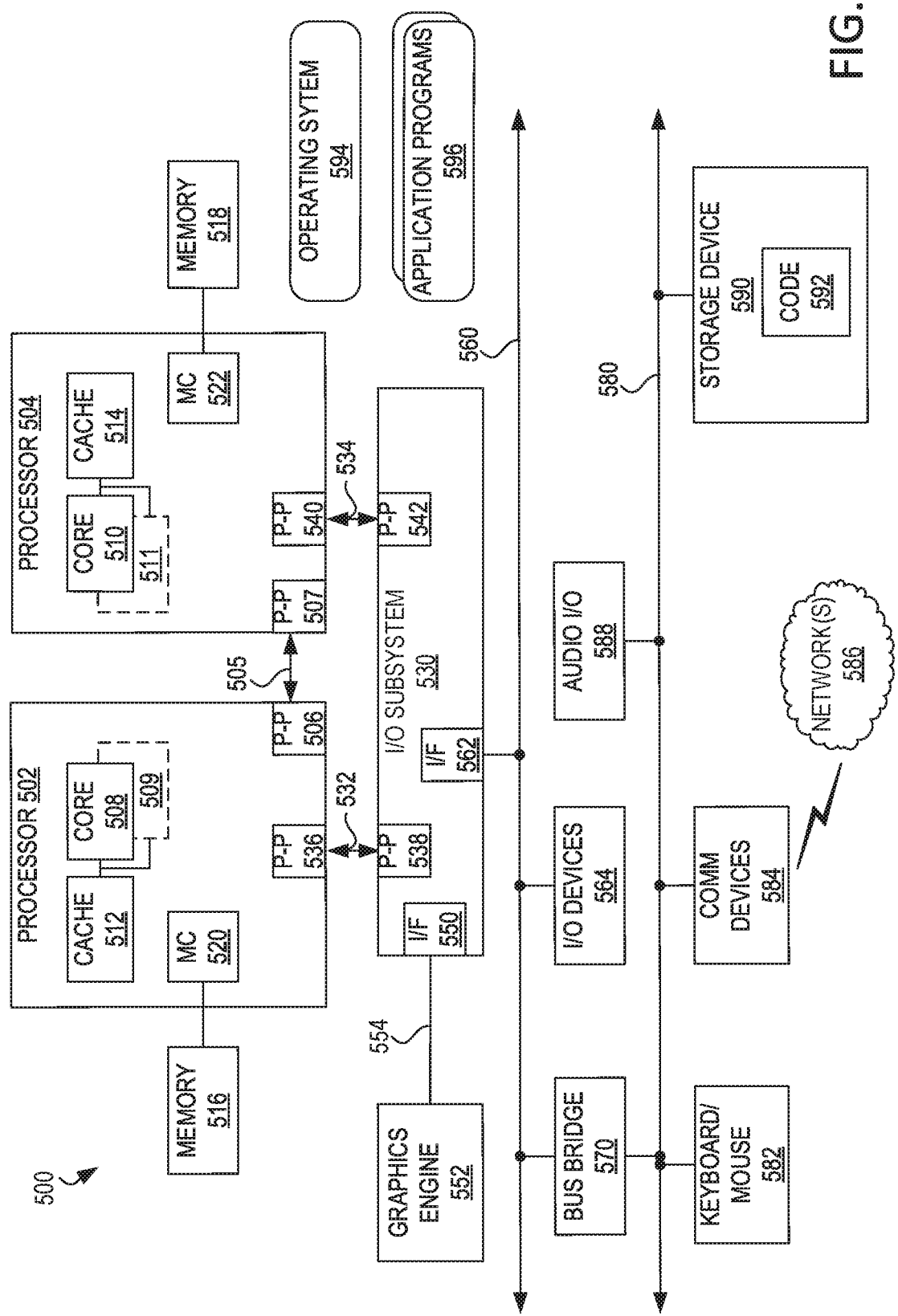
FIG. 5 is a block diagram of an exemplary computing device in which technologies described herein may be implemented.

FIG. 5 is a block diagram of an exemplary computing device in which technologies described herein may be implemented. Generally, components shown in FIG. 5 can communicate with other shown components, although not all connections are shown, for ease of illustration. The device 500 is a multiprocessor system comprising a first processor 502 and a second processor 504 and is illustrated as comprising point-to-point (P-P) interconnects. For example, a point-to-point (P-P) interface 506 of the processor 502 is coupled to a point-to-point interface 507 of the processor 504 via a point-to-point interconnection 505. It is to be understood that any or all of the point-to-point interconnects illustrated in FIG. 5 can be alternatively implemented as a multi-drop bus, and that any or all buses illustrated in FIG. 5 could be replaced by point-to-point interconnects.

As shown in FIG. 5, the processors 502 and 504 are multicore processors. Processor 502 comprises processor cores 508 and 509, and processor 504 comprises processor cores 510 and 511. Processor cores 508-511 can execute computer-executable instructions in a manner similar to that discussed below in connection with FIG. 6, or in other manners.

Processors 502 and 504 further comprise at least one shared cache memory 512 and 514, respectively. The shared caches 512 and 514 can store data (e.g., instructions) utilized by one or more components of the processor, such as the processor cores 508-509 and 510-511. The shared caches 512 and 514 can be part of a memory hierarchy for the device 500. For example, the shared cache 512 can locally store data that is also stored in a memory 516 to allow for faster access to the data by components of the processor 502. In some embodiments, the shared caches 512 and 514 can comprise multiple cache layers, such as level 1 (L1), level 2 (L2), level 3 (L3), level 4 (L4), and/or other caches or cache layers, such as a last level cache (LLC).

Although the device 500 is shown with two processors, the device 500 can comprise any number of processors. Further, a processor can comprise any number of processor cores. A processor can take various forms such as a central processing unit, a controller, a graphics processor, an accelerator (such as a graphics accelerator or digital signal processor (DSP)) or a field programmable gate array (FPGA). A processor in a device can be the same as or different from other processors in the device. In some embodiments, the device 500 can comprise one or more processors that are heterogeneous or asymmetric to a first processor, accelerator, FPGA, or any other processor. There can be a variety of differences between the processing elements in a system in terms of a spectrum of metrics of merit including architectural, microarchitectural, thermal, power consumption characteristics and the like. These differences can effectively manifest themselves as asymmetry and heterogeneity amongst the processors in a system. In some embodiments, the processors 502 and 504 reside in the same die package.

Processors 502 and 504 further comprise memory controller logic (MC) 520 and 522. As shown in FIG. 5, MCs 520 and 522 control memories 516 and 518 coupled to the processors 502 and 504, respectively. The memories 516 and 518 can comprise various types of memories, such as volatile memory (e.g., dynamic random access memories (DRAM), static random access memory (SRAM)) or non-volatile memory (e.g., flash memory). While MCs 520 and 522 are illustrated as being integrated into the processors 502 and 504, in alternative embodiments, the MCs can be logic external to a processor and can comprise one or more layers of a memory hierarchy.

Processors 502 and 504 are coupled to an Input/Output (I/O) subsystem 530 via P-P interconnections 532 and 534. The point-to-point interconnection 532 connects a point-to-point interface 1136 of the processor 502 with a point-to-point interface 538 of the I/O subsystem 530, and the point-to-point interconnection 534 connects a point-to-point interface 540 of the processor 504 with a point-to-point interface 542 of the I/O subsystem 530. Input/Output subsystem 530 further includes an interface 550 to couple I/O subsystem 530 to a graphics engine 552, which can be a high-performance graphics engine. The I/O subsystem 530 and the graphics engine 552 are coupled via a bus 554. Alternately, the bus 554 could be a point-to-point interconnection.

Input/Output subsystem 530 is further coupled to a first bus 560 via an interface 562. The first bus 560 can be a Peripheral Component Interconnect (PCI) bus, a PCI Express bus, another third generation I/O interconnection bus or any other type of bus.

Various I/O devices 564 can be coupled to the first bus 560. A bus bridge 570 can couple the first bus 560 to a second bus 580. In some embodiments, the second bus 580 can be a low pin count (LPC) bus. Various devices can be coupled to the second bus 580 including, for example, a keyboard/mouse 582, audio I/O devices 588 and a storage device 590, such as a hard disk drive, solid-state drive or other storage devices for storing computer-executable instructions (code) 592. The code 592 can comprise computer-executable instructions for performing technologies described herein. Additional components that can be coupled to the second bus 580 include communication device(s) 584, which can provide for communication between the device 500 and one or more wired or wireless networks 586 (e.g. Wi-Fi, cellular or satellite networks) via one or more wired or wireless communication links (e.g., wire, cable, Ethernet connection, radio-frequency (RF) channel, infrared channel, Wi-Fi channel) using one or more communication standards (e.g., IEEE 802.11 standard and its supplements).

The device 500 can comprise removable memory such as flash memory cards (e.g., SD (Secure Digital) cards), memory sticks, Subscriber Identity Module (SIM) cards). The memory in device 500 (including caches 512 and 514, memories 516 and 518 and storage device 590) can store data and/or computer-executable instructions for executing an operating system 594 and application programs 596. Example data includes web pages, text messages, images, sound files, video data, biometric thresholds for particular users or other data sets to be sent to and/or received from one or more network servers or other devices by the device 500 via one or more wired or wireless networks, or for use by the device 500. The device 500 can also have access to external memory (not shown) such as external hard drives or cloud-based storage.

The operating system 594 can control the allocation and usage of the components illustrated in FIG. 5 and support one or more application programs 596. The application programs 596 can include common mobile computing device applications (e.g., email applications, calendars, contact managers, web browsers, messaging applications) as well as other computing applications and utilities, such as a virtual keyboard.

The device 500 can support various input devices, such as a touchscreen, microphones, camera, physical keyboard, virtual keyboard, proximity sensor and trackball, and one or more output devices, such as a speaker and a display. Other possible input and output devices include piezoelectric and other haptic I/O devices. Any of the input or output devices can be internal to, external to or removably attachable with the device 500. External input and output devices can communicate with the device 500 via wired or wireless connections.

In addition, the computing device 500 can provide one or more natural user interfaces (NUIs). For example, the operating system 594 or applications 596 can comprise speech recognition logic as part of a voice user interface that allows a user to operate the device 500 via voice commands. Further, the device 500 can comprise input devices and logic that allows a user to interact with the device 500 via a body, hand or face gestures. For example, a user's hand gestures can be detected and interpreted to provide input to a gaming application.

The device 500 can further comprise one or more communication components 584. The components 584 can comprise wireless communication components coupled to one or more antennas to support communication between the system 500 and external devices. The wireless communication components can support various wireless communication protocols and technologies such as Near Field Communication (NFC), Wi-Fi, Bluetooth, 4G Long Term Evolution (LTE), Code Division Multiplexing Access (CDMA), Universal Mobile Telecommunication System (UMTS) and Global System for Mobile Telecommunication (GSM). In addition, the wireless modems can support communication with one or more cellular networks for data and voice communications within a single cellular network, between cellular networks, or between the mobile computing device and a public switched telephone network (PSTN).

The device 500 can further include at least one input/output port (which can be, for example, a USB, IEEE 1394 (FireWire), Ethernet and/or RS-232 port) comprising physical connectors; a power supply; a satellite navigation system receiver, such as a GPS receiver; a gyroscope; an accelerometer; a proximity sensor; and a compass. A GPS receiver can be coupled to a GPS antenna. The device 500 can further include one or more additional antennas coupled to one or more additional receivers, transmitters and/or transceivers to enable additional functions.

It is to be understood that FIG. 5 illustrates only one exemplary computing device architecture. Computing devices based on alternative architectures can be used to implement technologies described herein. For example, instead of the processors 502 and 504, and the graphics engine 552 being located on discrete integrated circuits, a computing device can comprise an SoC (system-on-a-chip) integrated circuit incorporating multiple processors, a graphics engine and additional components. Further, a computing device can connect elements via bus or point-to-point configurations different from that shown in FIG. 5. Moreover, the illustrated components in FIG. 5 are not required or all-inclusive, as shown components can be removed and other components added in alternative embodiments.

Figure 6:
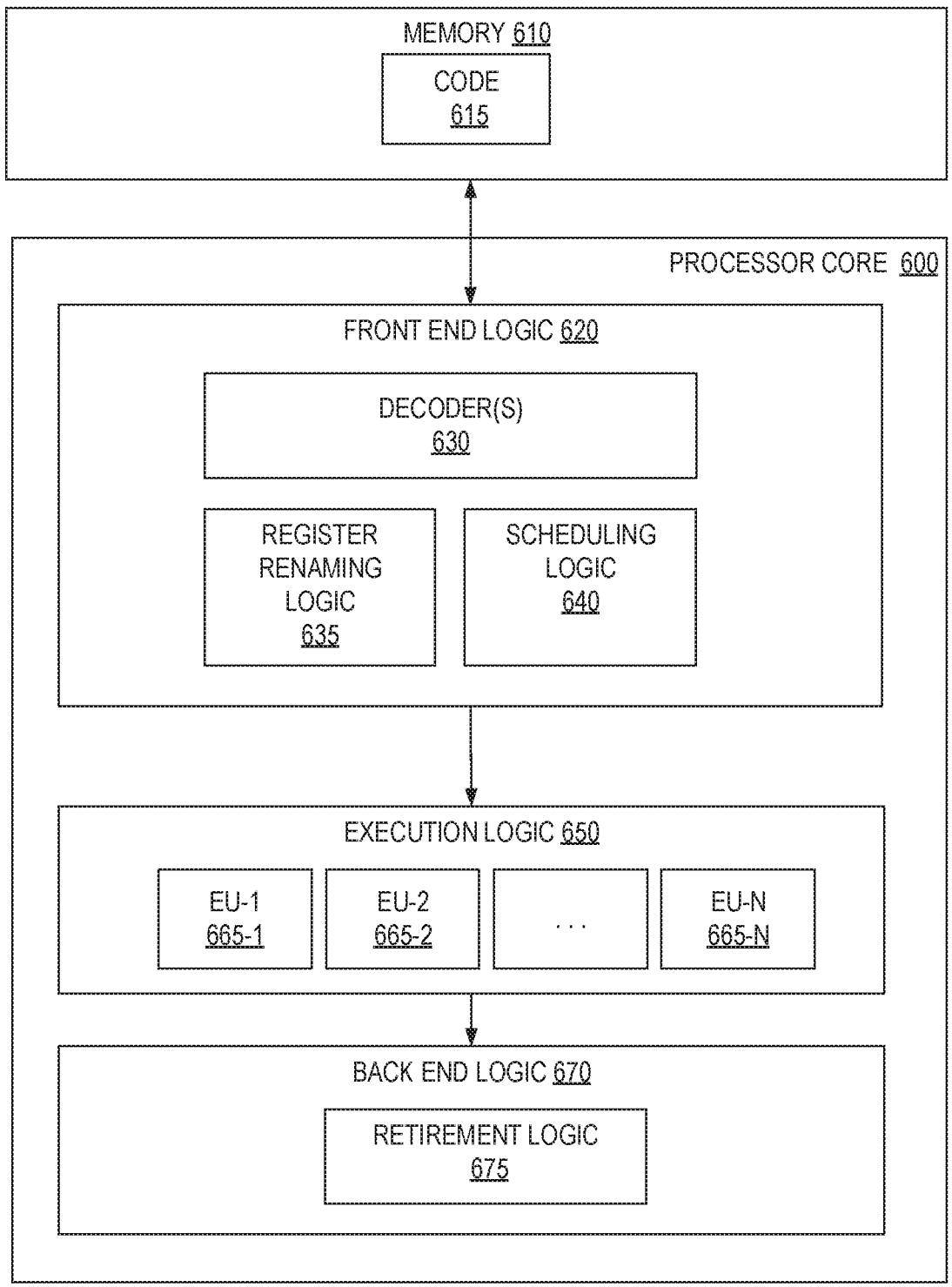
FIG. 6 is a block diagram of an exemplary processor core that can execute instructions as part of implementing technologies described herein.

FIG. 6 is a block diagram of an exemplary processor core 600 to execute computer-executable instructions as part of implementing technologies described herein. The processor core 600 can be a core for any type of processor, such as a microprocessor, an embedded processor, a digital signal processor (DSP) or a network processor. The processor core 600 can be a single-threaded core or a multithreaded core in that it may include more than one hardware thread context (or "logical processor") per core.

FIG. 6 also illustrates a memory 610 coupled to the processor 600. The memory 610 can be any memory described herein or any other memory known to those of skill in the art. The memory 610 can store computer-executable instruction 615 (code) executable by the processor core 600.

The processor core comprises front-end logic 620 that receives instructions from the memory 610. An instruction can be processed by one or more decoders 630. The decoder 630 can generate as its output a micro operation such as a fixed width micro operation in a predefined format, or generate other instructions, microinstructions, or control signals, which reflect the original code instruction. The front-end logic 620 further comprises register renaming logic 635 and scheduling logic 640, which generally allocate resources and queues operations corresponding to converting an instruction for execution.

The processor core 600 further comprises execution logic 650, which comprises one or more execution units (EUs) 665-1 through 665-N. Some processor core embodiments can include a number of execution units dedicated to specific functions or sets of functions. Other embodiments can include only one execution unit or one execution unit that can perform a particular function. The execution logic 650 performs the operations specified by code instructions. After completion of execution of the operations specified by the code instructions, back-end logic 670 retires instructions using retirement logic 675. In some embodiments, the processor core 600 allows out of order execution but requires in-order retirement of instructions. Retirement logic 670 can take a variety of forms as known to those of skill in the art (e.g., re-order buffers or the like).

The processor core 600 is transformed during execution of instructions, at least in terms of the output generated by the decoder 630, hardware registers and tables utilized by the register renaming logic 635, and any registers (not shown) modified by the execution logic 650. Although not illustrated in FIG. 6, a processor can include other elements on an integrated chip with the processor core 600. For example, a processor may include additional elements such as memory control logic, one or more graphics engines, I/O control logic and/or one or more caches.

Figure 7:
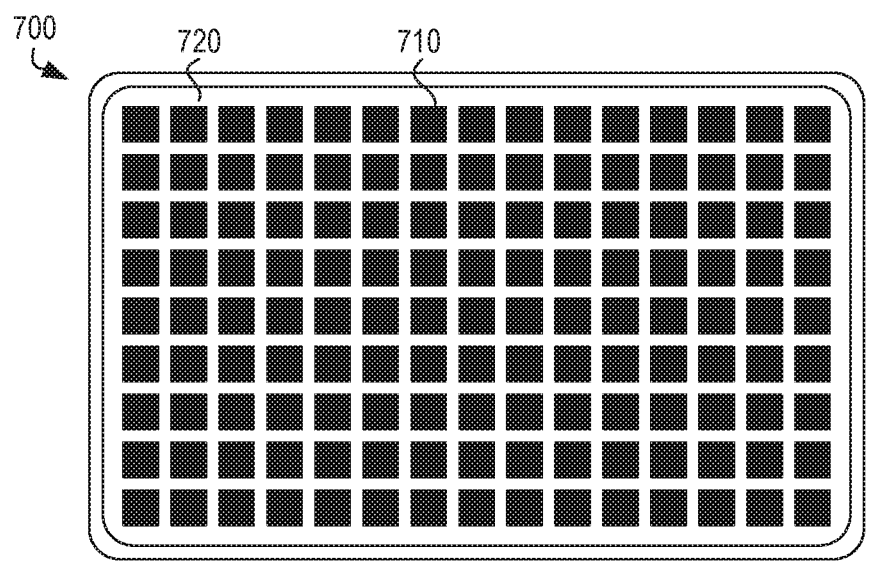
FIG. 7 is an exemplary arrangement of micro-LED elements according to some embodiments.

FIG. 7 illustrates exemplary arrangements of micro-LED elements according to some embodiments and arranged in a display 700, which may correspond to the display architecture of FIG. 1. On display 700, an array of micro-LED elements 710, such as those described in relation of any of the embodiments above, are distributed across a display area 720 which corresponds to a backplane of the display. The display may be a glass display, such as, by way of example a touchscreen display, or a non-touchscreen display.

Figure 8:
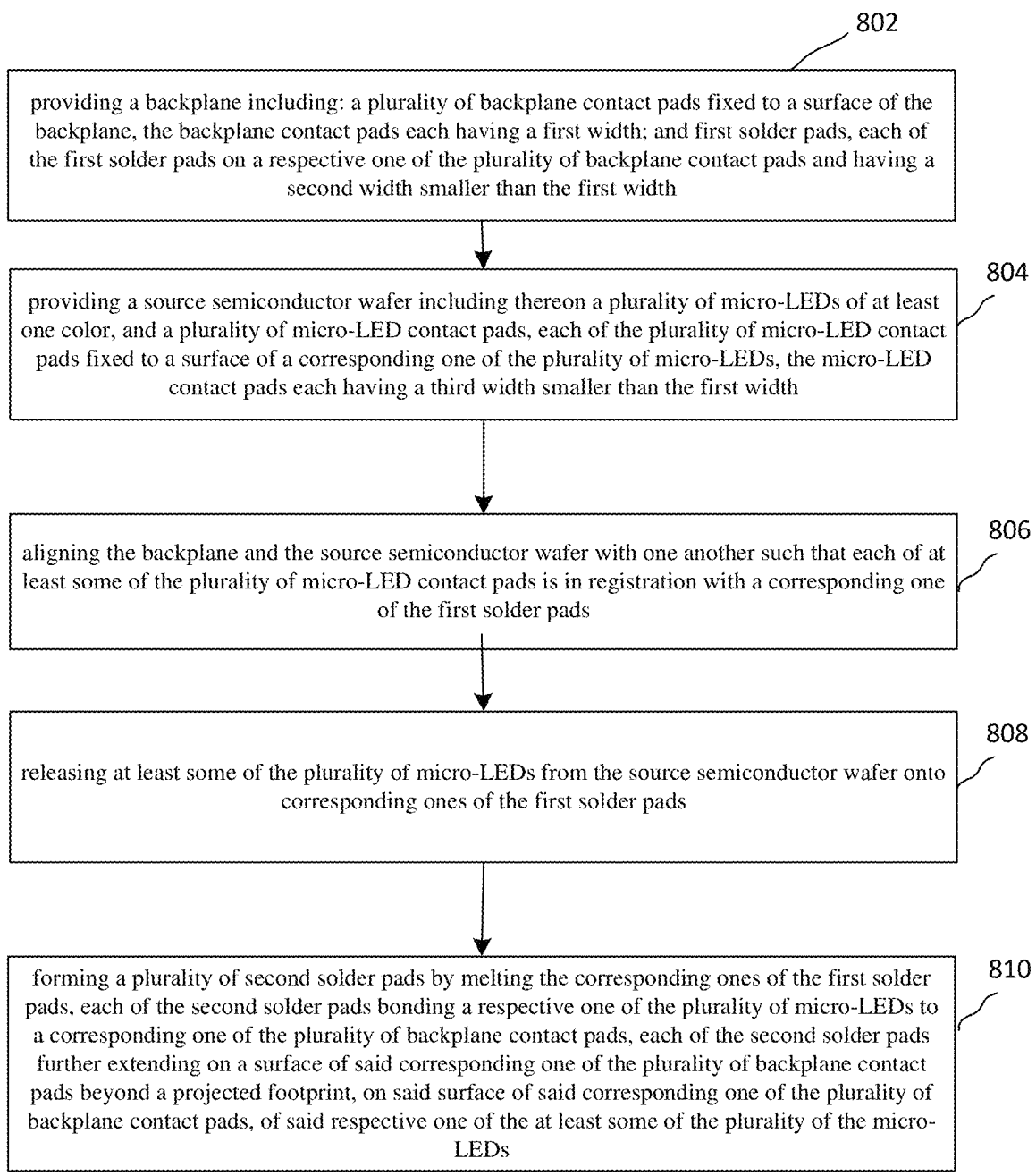
FIG. 8 is a flow diagram showing a process according to some embodiments.

FIG. 8 shows a process 800 according to some embodiments. In process 800, at operation 802, providing a backplane including: a plurality of backplane contact pads fixed to a surface of the backplane, the backplane contact pads each having a first width; and first solder pads, each of the first solder pads on a respective one of the plurality of backplane contact pads and having a second width smaller than the first width. At operation 804, the process 800 includes providing a source semiconductor wafer including thereon a plurality of micro-LEDs of at least one color, and a plurality of micro-LED contact pads, each of the plurality of micro-LED contact pads fixed to a surface of a corresponding one of the plurality of micro-LEDs, the micro-LED contact pads each having a third width smaller than the first width. At operation 806, process 800 includes aligning the backplane and the source semiconductor wafer with one another such that each of at least some of the plurality of micro-LED contact pads is in registration with a corresponding one of the first solder pads. At operation 808, the process includes releasing at least some of the plurality of micro-LEDs from the source semiconductor wafer onto corresponding ones of the first solder pads. At operation 810, the process includes forming a plurality of second solder pads by melting the corresponding ones of the first solder pads, respective ones of the plurality of second solder pads bonding respective ones of the at least some of the plurality of micro-LEDs to corresponding ones of the plurality of backplane contact pads, the second solder pads further extending on said corresponding ones of the plurality of backplane contact pads beyond a footprint thereon of said some of the plurality of micro-LED contact pads.

Software may be embodied as a software package, code, instructions, instruction sets and/or data recorded on non-transitory computer readable storage mediums. Firmware may be embodied as code, instructions or instruction sets and/or data that are hard-coded (e.g., nonvolatile) in memory devices. As used in any embodiment herein, the term "circuitry" can comprise, for example, singly or in any combination, hardwired circuitry, programmable circuitry such as computer processors comprising one or more individual instruction processing cores, state machine circuitry, and/or firmware that stores instructions executed by programmable circuitry. Modules described herein may, collectively or individually, be embodied as circuitry that forms a part of one or more devices. Thus, any of the modules can be implemented as circuitry, such as continuous itemset generation circuitry, entropy-based discretization circuitry, etc. A computer device referred to as being programmed to perform a method can be programmed to perform the method via software, hardware, firmware or combinations thereof.

Any of the disclosed methods can be implemented as computer-executable instructions or a computer program product. Such instructions can cause a computer or one or more processors capable of executing computer-executable instructions to perform any of the disclosed methods. Generally, as used herein, the term "computer" refers to any computing device or system described or mentioned herein, or any other computing device. Thus, the term "computer-executable instruction" refers to instructions that can be executed by any computing device described or mentioned herein, or any other computing device.

The computer-executable instructions or computer program products, as well as any data created and used during implementation of the disclosed technologies, can be stored on one or more tangible or non-transitory computer-readable storage media, such as optical media discs (e.g., DVDs, CDs), volatile memory components (e.g., DRAM, SRAM), or non-volatile memory components (e.g., flash memory, solid state drives, chalcogenide-based phase-change non-volatile memories). Computer-readable storage media can be contained in computer-readable storage devices such as solid-state drives, USB flash drives, and memory modules. Alternatively, the computer-executable instructions may be performed by specific hardware components that contain hardwired logic for performing all or a portion of disclosed methods, or by any combination of computer-readable storage media and hardware components.

The computer-executable instructions can be part of, for example, a dedicated software application or a software application that is accessed via a web browser or other software application (such as a remote computing application). Such software can be read and executed by, for example, a single computing device or in a network environment using one or more networked computers. Further, it is to be understood that the disclosed technology is not limited to any specific computer language or program. For instance, the disclosed technologies can be implemented by software written in C++, Java, Perl, JavaScript, Adobe Flash, or any other suitable programming language. Likewise, the disclosed technologies are not limited to any particular computer or type of hardware.

Furthermore, any of the software-based embodiments (comprising, for example, computer-executable instructions for causing a computer to perform any of the disclosed methods) can be uploaded, downloaded or remotely accessed in a variety of manners. For example, such instructions can be uploaded, downloaded or remotely accessed using the Internet, the World Wide Web, an intranet, cable (including fiber optic cable), magnetic communications, electromagnetic communications (including RF, microwave, and infrared communications), and electronic communications.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrase "at least one of A, B or C" can mean A; B; C; A and B; A and C; B and C; or A, B, and C.

The disclosed methods, apparatuses and systems are not to be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present or problems be solved.

Theories of operation, scientific principles or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

Although the operations of some of the disclosed methods are described in a particular, sequential order for convenient presentation, it is to be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

The following examples pertain to additional embodiments of technologies disclosed herein.

Example 1 includes micro-light-emitting diode (micro-LED) display structure comprising: a backplane: including a plurality of backplane contact pads fixed to a surface of the backplane, the backplane contact pads each having a first width; a plurality of micro-light-emitting diodes (micro-LEDs) of different colors bonded to the backplane contact pads; a plurality of micro-LED contact pads fixed between the micro-LEDs and the backplane contact pads and each having a second width smaller than the first width; and solder pads, each of the solder pads bonding respective ones of the at least some of the plurality of micro-LEDs to a corresponding one of the plurality of backplane contact pads, each of the solder pads further extending on said corresponding one of the plurality of backplane contact pads beyond a footprint thereon of said one of the plurality of the micro-LEDs.

Example 2 includes the subject matter of Example 1, and optionally, wherein more than about 50% of said each of the solder pads' thickness exhibits a composition that is from about 90% to about 95% free of intermetallic compounds.

Example 3 includes the subject matter of Example 2, and optionally, wherein the solder pads include a solder material including tin silver copper (SAC) or lead, and a concentration from about 0% to about 10% of silver or copper, the solder material making up the composition that is from about 90% to about 95% free of intermetallic compounds.

Example 4 includes the subject matter of Example 1, and optionally, wherein the first width is between about 1.5 times to about 3 times larger than the second width.

Example 5 includes the subject matter of Example 3, and optionally, wherein a pitch between the plurality of backplane contact pads is 4 to 10 times larger than the first width.

Example 6 includes the subject matter of Example 1, and optionally, wherein the plurality of micro-LEDs include micro-LEDs having at least one of different sizes or different micro-LED structures.

Example 7 includes the subject matter of Example 1, and optionally, wherein: the backplane includes glass; and the plurality of backplane contact pads and the plurality of micro-LED contact pads include at least one of: a metal including one of copper, nickel, gold, tungsten, titanium, tantalum, ruthenium, zirconium, cobalt, aluminum, lead, platinum, tin, or silver; a conducting metallic compound material including one of copper nitride, tantalum nitride, titanium nitride, tantalum carbide, titanium carbide, titanium aluminum carbide, tungsten silicide, tungsten nitride, ruthenium oxide, cobalt silicide, or nickel silicide; carbon nanotubes; conductive carbon; or graphene.

Example 8 includes a method of fabricating a micro-light-emitting diode (micro-LED) display structure including: providing a backplane including: a plurality of backplane contact pads fixed to a surface of the backplane, the backplane contact pads each having a first width; and first solder pads, each of the first solder pads on a respective one of the plurality of backplane contact pads and having a second width smaller than the first width; providing a source semiconductor wafer including thereon a plurality of micro-LEDs of at least one color, and a plurality of micro-LED contact pads, each of the plurality of micro-LED contact pads fixed to a surface of a corresponding one of the plurality of micro-LEDs, the micro-LED contact pads each having a third width smaller than the first width; aligning the backplane and the source semiconductor wafer with one another such that each of at least some of the plurality of micro-LED contact pads is in registration with a corresponding one of the first solder pads; releasing at least some of the plurality of micro-LEDs from the source semiconductor wafer onto corresponding ones of the first solder pads; and forming a plurality of second solder pads by melting the corresponding ones of the first solder pads, respective ones of the plurality of second solder pads bonding respective ones of the at least some of the plurality of micro-LEDs to corresponding ones of the plurality of backplane contact pads, the second solder pads further extending on said corresponding ones of the plurality of backplane contact pads beyond a footprint thereon of said some of the plurality of micro-LED contact pads.

Example 9 includes the subject matter of Example 8, wand optionally, herein the third width is substantially equal to the second width, and wherein a thickness of the first solder pads is substantially equal to the second width.

Example 10 includes the subject matter of Example 8, wand optionally, herein the at least one color includes different colors and the at least some of the micro-LEDs include micro-LEDs of different colors.

Example 11 includes the subject matter of Example 8, wand optionally, herein the source semiconductor wafer is a first source semiconductor wafer, the plurality of micro-LEDs includes a first plurality of micro-LEDs, the plurality of micro-LED contact pads includes a first plurality of micro-LED contact pads, the plurality of second solder pads include first plurality of second solder pads, the corresponding ones of the first solder pads define a first set of the first solder pads, and the corresponding ones of the plurality of backplane contact pads a first set of the plurality of backplane contact pads, the method further including: after forming the first plurality of second solder pads, providing a second source semiconductor wafer including thereon a second plurality of micro-LEDs, and a second plurality of micro-LED contact pads, each of the second plurality of micro-LED contact pads fixed to a surface of a corresponding one of the second plurality of micro-LEDs, the second plurality of micro-LED contact pads each having a fourth width smaller than the first width; aligning the backplane and the second source semiconductor wafer with one another such that each of at least some of the second plurality of micro-LED contact pads is in registration with a corresponding one of the first solder pads; releasing at least some of the second plurality of micro-LEDs from the second source semiconductor wafer onto corresponding ones of the first solder pads that form a second set of the first solder pads different from the first set of the first solder pads; and forming a second plurality of second solder pads by melting the second set of the first solder pads, respective ones of the second plurality of second solder pads bonding respective ones of the at least some of the second plurality of micro-LED contact pads to corresponding ones of the plurality of backplane contact pads that form a second set of the plurality of backplane contact pads different from the first set of the plurality of backplane contact pads, the second plurality of second solder pads further extending on said second set of the plurality of backplane contact pads beyond a footprint thereon of said some of the second plurality of micro-LED contact pads.

Example 12 includes the subject matter of Example 11, and optionally, wherein the at least one color includes a single first color, the second plurality of micro-LEDs being of as single second color different from the first color.

Example 13 includes the subject matter of Example 8, wand optionally, herein melting includes at least one of applying heat to an underside of the backplane across a surface thereof, or applying heat using infra-red (IR) laser radiation applied in a localized manner to each of the corresponding ones of the first solder pads.

Example 14 includes the subject matter of Example 8, wand optionally, herein melting includes applying heat using infra-red (IR) laser radiation, the IR laser radiation has a wavelength of about 2000 nm, and a pulse of about 1 ns-1 us and about 1 nJ-100 nJ.

Example 15 includes the subject matter of Example 8, and optionally, wherein more than about 50% of each of the second solder pads' thickness exhibits a composition that is from about 90% to about 95% of the composition of the first solder pads.

Example 16 includes the subject matter of Example 15, and optionally, wherein the first solder pads include a solder material including tin silver copper (SAC) or lead, and a concentration from about 0% to about 10% of silver or copper.

Example 17 includes the subject matter of Example 8, and optionally, wherein the first width is between about 1.5 times to about 3 times larger than the second width; and the second width is between about 4 μm to about 30 μm.

Example 18 includes the subject matter of Example 8, and optionally, wherein a pitch between the plurality of backplane contact pads is about 4-10 times larger than the first width.

Example 19 includes the subject matter of Example 8, and optionally, wherein the plurality of micro-LEDs include micro-LEDs having at least one of different sizes or different micro-LED structures.

Example 20 includes a display structure for a micro-light-emitting diode (micro-LED) display structure comprising: a backplane; a plurality of backplane contact pads fixed to a surface of the backplane, the backplane contact pads each having a first width; and solder pads on respective ones of the plurality of backplane contact pads, the solder pads having a second width smaller than the first width, wherein the first width is between about 1.5 times to about 3 times larger than the second width.

Example 21 includes the subject matter of Example 20, and optionally, wherein the second width is between about 4 μm to about 30 μm.

Example 22 includes the subject matter of Example 20, and optionally, wherein the solder pads include a solder material including tin silver copper (SAC) or lead, and a concentration from about 0% to about 10% of silver or copper.

Example 23 includes the subject matter of Example 20, and optionally, wherein a pitch between the plurality of backplane contact pads is about 4 to 10 times larger than the first width.

Example 24 includes a product comprising one or more tangible computer-readable non-transitory storage media comprising computer-executable instructions operable to, when executed by at least one computer processor, enable the at least one computer processor to implement operations comprising: aligning a backplane and a source semiconductor wafer with one another, wherein: the backplane includes a plurality of backplane contact pads fixed to a surface of the backplane, the backplane contact pads each having a first width, and first solder pads, each of the first solder pads on a respective one of the plurality of backplane contact pads and having a second width smaller than the first width; and the source semiconductor wafer includes thereon a plurality of micro-LEDs of at least one color, and a plurality of micro-LED contact pads, each of the plurality of micro-LED contact pads fixed to a surface of a corresponding one of the plurality of micro-LEDs, the micro-LED contact pads each having a third width smaller than the first width; aligning is such that each of at least some of the plurality of micro-LED contact pads is in registration with a corresponding one of the first solder pads; releasing at least some of the plurality of micro-LEDs from the source semiconductor wafer onto corresponding ones of the first solder pads; and forming a plurality of second solder pads by melting the corresponding ones of the first solder pads, respective ones of the plurality of second solder pads bonding respective ones of the at least some of the plurality of micro-LEDs to corresponding ones of the plurality of backplane contact pads, the second solder pads further extending on said corresponding ones of the plurality of backplane contact pads beyond a footprint thereon of said some of the plurality of micro-LED contact pads.

Example 25 includes the subject matter of Example 24, and optionally, wherein: the first width is between about 1.5 times to about 3 times larger than the second width; and the second width is between about 4 μm to about 30 μm.

What we claim is:

1. A micro-light-emitting diode (micro-LED) display structure comprising:
   a backplane;
   a plurality of backplane contact pads fixed to a surface of the backplane, the backplane contact pads each having a first width;
   a plurality of micro-light-emitting diodes (micro-LEDs) of different colors bonded to the plurality of backplane contact pads;
   a plurality of micro-LED contact pads fixed between the micro-LEDs and the backplane contact pads and each having a second width smaller than the first width; and
   solder pads, each of the solder pads bonding a respective one of the plurality of micro-LEDs to a corresponding one of the plurality of backplane contact pads, each of the solder pads further extending on a surface of said corresponding one of the plurality of backplane contact pads beyond a projected footprint, on said surface of said corresponding one of the plurality of backplane contact pads, of said respective one of the plurality of the micro-LEDs, wherein more than about 50% of a thickness of said each of the solder pads exhibits a composition that is from about 90% to about 95% free of intermetallic compounds.

2. The display structure of claim 1, wherein the first width is between about 1.5 times to about 3 times larger than the second width.

3. The display structure of claim 1, wherein the plurality of micro-LEDs include micro-LEDs having at least one of different sizes or different micro-LED structures.

4. The display structure of claim 1,
wherein: the backplane includes glass; and
each of the plurality of backplane contact pads and each of the plurality of micro-LED contact pads include at least one of:
 a metal including one of copper, nickel, gold, tungsten, titanium, tantalum, ruthenium, zirconium, cobalt, aluminum, lead, platinum, tin, or silver;
 a conducting metallic compound material including one of copper nitride, tantalum nitride, titanium nitride, tantalum carbide, titanium carbide, titanium aluminum carbide, tungsten silicide, tungsten nitride, ruthenium oxide, cobalt silicide, or nickel silicide;
 carbon nanotubes;
 conductive carbon; or
 graphene.

5. The display structure of claim 1, wherein the solder pads include a solder material including tin silver copper (SAC) or lead, and a concentration from about 0% to about 10% of silver or copper, the solder material making up the composition that is from about 90% to about 95% free of intermetallic compounds.

6. The display structure of claim 5, wherein a pitch between the plurality of backplane contact pads is about 4 to 10 times larger than the first width.

7. A backplane for a micro-light-emitting diode (micro-LED) display structure comprising:
 a plurality of backplane contact pads fixed to a surface of the backplane, the backplane contact pads each having a first width; and
 solder pads on respective ones of the plurality of backplane contact pads, the solder pads having a second width smaller than the first width, wherein the first width is between about 1.5 times to about 3 times larger than the second width, wherein the second width is between about 4 μm to about 30 μm.

8. The backplane of claim 7, wherein the solder pads include a solder material including tin silver copper (SAC) or lead, and a concentration from about 0% to about 10% of silver or copper.

9. The backplane of claim 7, wherein a pitch between the plurality of backplane contact pads is about 7.5 times larger than the first width.

* * * * *